(12) United States Patent
Lee et al.

(10) Patent No.: US 11,984,410 B2
(45) Date of Patent: May 14, 2024

(54) AIR CHANNEL FORMATION IN PACKAGING PROCESS

(71) Applicant: Taiwan Semiconductor Manufacturing Co., Ltd., Hsinchu (TW)

(72) Inventors: Wan-Yu Lee, Taipei (TW); Chiang Lin, Taoyuan (TW); Yueh-Ting Lin, Taipei (TW); Hua-Wei Tseng, New Taipei (TW); Li-Hsien Huang, Zhubei (TW); Yu-Hsiang Hu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/312,705

(22) Filed: May 5, 2023

(65) Prior Publication Data

US 2023/0275040 A1 Aug. 31, 2023

Related U.S. Application Data

(60) Continuation of application No. 17/396,907, filed on Aug. 9, 2021, now Pat. No. 11,682,637, which is a
(Continued)

(51) Int. Cl.
*H01L 23/482* (2006.01)
*H01L 21/56* (2006.01)
(Continued)

(52) U.S. Cl.
CPC .......... *H01L 23/585* (2013.01); *H01L 21/563* (2013.01); *H01L 23/3128* (2013.01);
(Continued)

(58) Field of Classification Search
CPC ............. H01L 23/4821; H01L 23/4855; H01L 23/522; H01L 23/482
See application file for complete search history.

(56) References Cited

U.S. PATENT DOCUMENTS

| 6,841,455 B2 | 1/2005 | West et al. |
| 8,361,842 B2 | 1/2013 | Yu et al. |

(Continued)

FOREIGN PATENT DOCUMENTS

| JP | 2011134893 A | 7/2011 |
| JP | 2015138874 A | 7/2015 |

(Continued)

*Primary Examiner* — Jae Lee
(74) *Attorney, Agent, or Firm* — Slater Matsil, LLP

(57) ABSTRACT

A method includes forming a reconstructed wafer including encapsulating a device die in an encapsulant, forming a dielectric layer over the device die and the encapsulant, forming a plurality of redistribution lines extending into the dielectric layer to electrically couple to the device die, and forming a metal ring in a common process for forming the plurality of redistribution lines. The metal ring encircles the plurality of redistribution lines, and the metal ring extends into scribe lines of the reconstructed wafer. A die-saw process is performed along scribe lines of the reconstructed wafer to separate a package from the reconstructed wafer. The package includes the device die and at least a portion of the metal ring.

20 Claims, 25 Drawing Sheets

Related U.S. Application Data division of application No. 16/427,516, filed on May 31, 2019, now Pat. No. 11,088,094.

(51) Int. Cl.
*H01L 23/00* (2006.01)
*H01L 23/31* (2006.01)
*H01L 23/48* (2006.01)
*H01L 23/522* (2006.01)
*H01L 23/528* (2006.01)
*H01L 23/58* (2006.01)

(52) U.S. Cl.
CPC ........ *H01L 23/481* (2013.01); *H01L 23/5226* (2013.01); *H01L 23/5283* (2013.01); *H01L 24/17* (2013.01); *H01L 24/32* (2013.01); *H01L 24/73* (2013.01); *H01L 2224/0231* (2013.01); *H01L 2224/02373* (2013.01); *H01L 2224/02379* (2013.01); *H01L 2224/02381* (2013.01); *H01L 2224/0401* (2013.01); *H01L 2224/73253* (2013.01); *H01L 2924/1436* (2013.01)

(56) References Cited

U.S. PATENT DOCUMENTS

| | | |
|---|---|---|
| 8,680,647 B2 | 3/2014 | Yu et al. |
| 8,703,542 B2 | 4/2014 | Lin et al. |
| 8,706,756 B2 | 4/2014 | Zhiguo et al. |
| 8,759,964 B2 | 6/2014 | Pu et al. |
| 8,778,738 B1 | 7/2014 | Lin et al. |
| 8,785,299 B2 | 7/2014 | Mao et al. |
| 8,791,574 B2 | 7/2014 | Akiba et al. |
| 8,803,306 B1 | 8/2014 | Yu et al. |
| 8,809,996 B2 | 8/2014 | Chen et al. |
| 8,829,676 B2 | 9/2014 | Yu et al. |
| 8,877,554 B2 | 11/2014 | Tsai et al. |
| 9,230,920 B2 | 1/2016 | Ishii |
| 9,502,489 B2 | 11/2016 | Funaya et al. |
| 9,620,488 B2 | 4/2017 | Yu et al. |
| 10,050,004 B2 | 8/2018 | Scanlan et al. |
| 10,510,734 B2 | 12/2019 | Chen et al. |
| 10,665,557 B2 | 5/2020 | Han et al. |
| 10,840,218 B2 | 11/2020 | Lin et al. |
| 2005/0184362 A1 | 8/2005 | Fujita |
| 2010/0078772 A1 | 4/2010 | Robinson |
| 2011/0156219 A1 | 6/2011 | Kawashima et al. |
| 2011/0221041 A1 | 9/2011 | Lin et al. |
| 2011/0291288 A1 | 12/2011 | Wu et al. |
| 2012/0032314 A1 | 2/2012 | Chen et al. |
| 2012/0104561 A1* | 5/2012 | Kuo ...................... H01L 23/481 257/621 |
| 2012/0326307 A1* | 12/2012 | Jeong .................. H01L 25/0657 257/738 |
| 2013/0026468 A1 | 1/2013 | Yoshimuta et al. |
| 2013/0062760 A1 | 3/2013 | Hung et al. |
| 2013/0062761 A1 | 3/2013 | Lin et al. |
| 2013/0168848 A1 | 7/2013 | Lin et al. |
| 2013/0307140 A1 | 11/2013 | Huang et al. |
| 2014/0203429 A1 | 7/2014 | Yu et al. |
| 2014/0225222 A1 | 8/2014 | Yu et al. |
| 2014/0252646 A1 | 9/2014 | Hung et al. |
| 2014/0264930 A1 | 9/2014 | Yu et al. |
| 2014/0339707 A1 | 11/2014 | Lin |
| 2014/0367160 A1 | 12/2014 | Yu et al. |
| 2015/0235845 A1 | 8/2015 | Sekita et al. |
| 2016/0276284 A1 | 9/2016 | Chen et al. |
| 2017/0110421 A1 | 4/2017 | Liu et al. |
| 2017/0317034 A1 | 11/2017 | Liu et al. |
| 2019/0103362 A1 | 4/2019 | Lin et al. |
| 2020/0091100 A1* | 3/2020 | Han .................. H01L 21/67253 |
| 2020/0312781 A1 | 10/2020 | Signorini et al. |
| 2021/0057326 A1* | 2/2021 | Ding ........................ H01L 24/48 |

FOREIGN PATENT DOCUMENTS

| | | |
|---|---|---|
| JP | 2015173253 A | 10/2015 |
| JP | 6061726 B2 | 1/2017 |
| KR | 20010014950 A | 2/2001 |
| KR | 20050077025 A | 7/2005 |
| KR | 20100036241 A | 4/2010 |
| KR | 20100086436 A | 7/2010 |
| KR | 20170009674 A | 1/2017 |
| KR | 20180030391 A | 3/2018 |
| KR | 101855562 B1 | 5/2018 |
| KR | 20180084878 A | 7/2018 |
| KR | 20190012307 A | 2/2019 |
| TW | 201916300 A | 4/2019 |

* cited by examiner

AIR CHANNEL FORMATION IN PACKAGING PROCESS

PRIORITY CLAIM

This application is a continuation of U.S. patent application Ser. No. 17/396,907, entitled "Air Channel Formation in Packaging Process," filed on Aug. 9, 2021, which is a divisional of U.S. patent application Ser. No. 16/427,516, entitled "Air Channel Formation in Packaging Process," filed on May 31, 2019, now U.S. Pat. No. 11,088,094, issued Aug. 10, 2021, which applications are incorporated herein by reference.

BACKGROUND

With the evolving of semiconductor technologies, semiconductor chips/dies are becoming increasingly smaller. In the meantime, more functions need to be integrated into the semiconductor dies. Accordingly, the semiconductor dies need to have increasingly greater numbers of I/O pads packed into smaller areas, and the density of the I/O pads rises quickly over time. As a result, the packaging of the semiconductor dies becomes more difficult, which adversely affects the yield of the packaging.

Conventional package technologies can be divided into two categories. In the first category, dies on a wafer are packaged before they are sawed. This packaging technology has some advantageous features, such as a greater throughput and a lower cost. Further, less underfill or molding compound is needed. However, this packaging technology also suffers from drawbacks. Since the sizes of the dies are becoming increasingly smaller, and the respective packages can only be fan-in type packages, in which the I/O pads of each die are limited to a region directly over the surface of the respective die. With the limited areas of the dies, the number of the I/O pads is limited due to the limitation of the pitch of the I/O pads. If the pitch of the pads is to be decreased, solder bridges may occur. Additionally, under the fixed ball-size requirement, solder balls must have a certain size, which in turn limits the number of solder balls that can be packed on the surface of a die.

In the other category of packaging, dies are sawed from wafers before they are packaged. An advantageous feature of this packaging technology is the possibility of forming fan-out packages, which means the I/O pads on a die can be redistributed to a greater area than the die, and hence the number of I/O pads formed on the surfaces of the dies can be increased. Another advantageous feature of this packaging technology is that "known-good-dies" are packaged, and defective dies are discarded, and hence cost and effort are not wasted on the defective dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
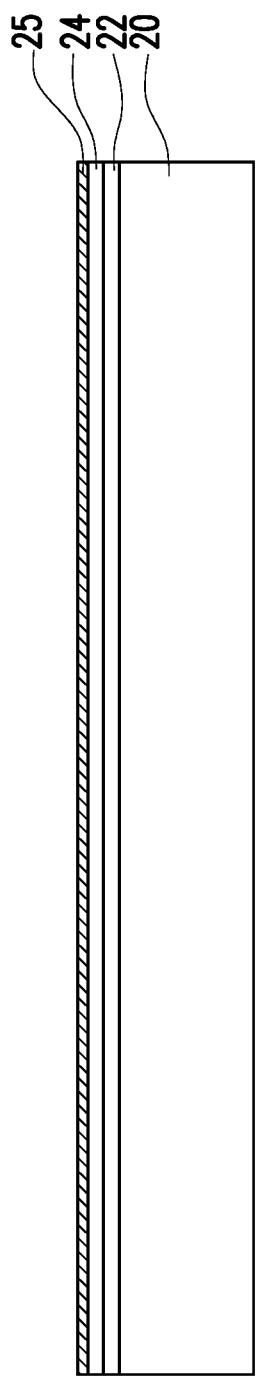
FIGS. 1 through 16 illustrate intermediate stages in the formation of a package in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package including air channels and the method of forming the same are provided in accordance with various embodiments. The intermediate stages of forming an Integrated Fan-Out (InFO) package are illustrated in accordance with some embodiments. Some variations of some embodiments are discussed. Throughout the various views and illustrative embodiments, like reference numbers are used to designate like elements.

Embodiments will be described with respect to a specific context, namely a package including air channels. Embodiments discussed herein are to provide examples to enable making or using the subject matter of this disclosure, and a person having ordinary skill in the art will readily understand modifications that can be made while remaining within contemplated scopes of different embodiments. Like reference numbers and characters in the figures below refer to like components. Although method embodiments may be discussed as being performed in a particular order, other method embodiments may be performed in any logical order.

Figure 26:
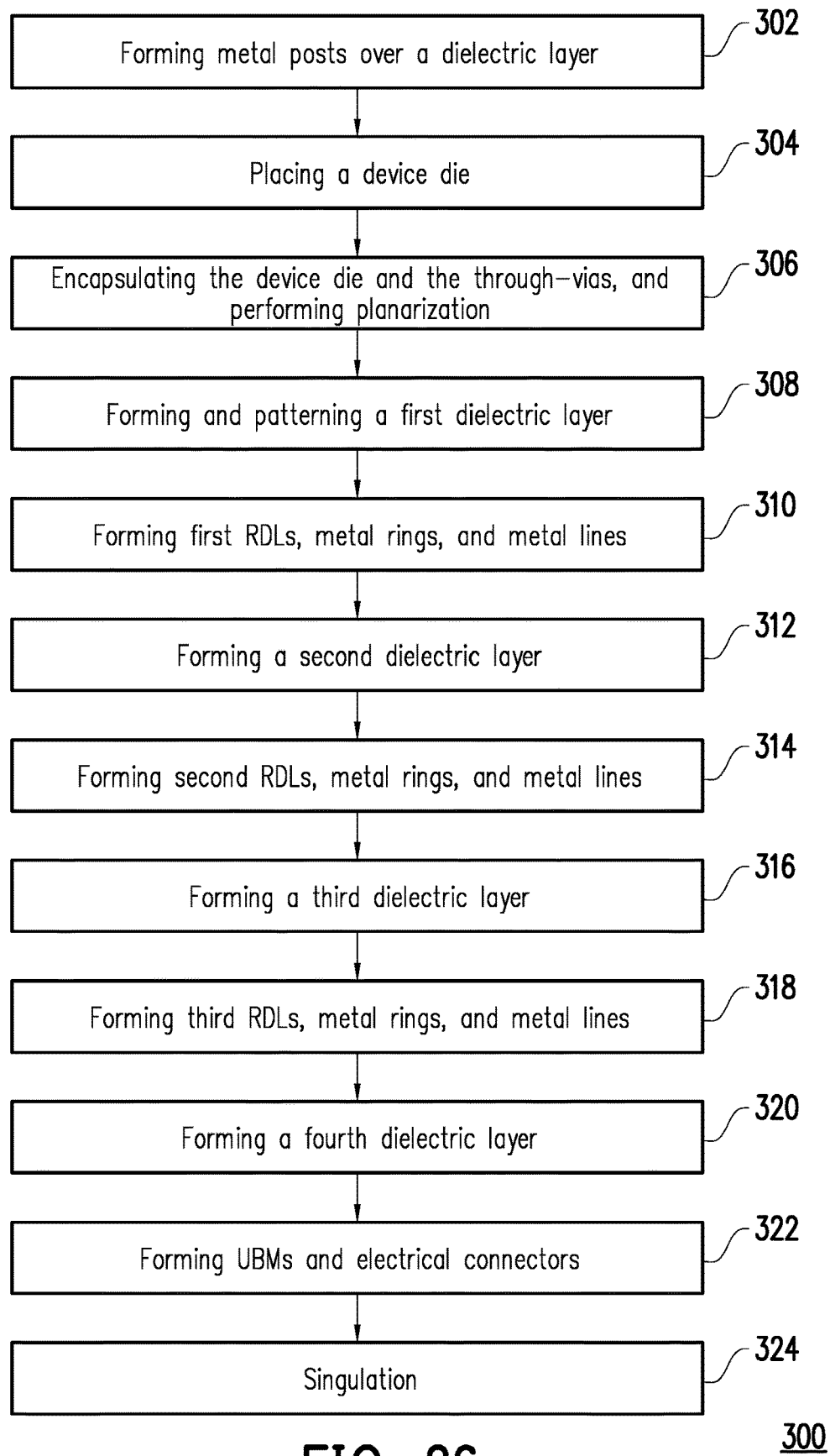
FIG. 26 illustrates a process flow for forming a package in accordance with some embodiments.

FIGS. 1 through 16 illustrate the cross-sectional views of intermediate stages in the formation of a package in accordance with some embodiments. The processes shown in FIG. 1 through 16 are also illustrated schematically in the process flow 300 shown in FIG. 26.

Referring to FIG. 1, carrier 20 is provided, and release film 22 is coated on carrier 20. Carrier 20 is formed of a transparent material, and may be a glass carrier, a ceramic carrier, an organic carrier, or the like. Carrier 20 may have a round top-view shape, and may have a size of a silicon wafer. Release film 22 is in physical contact with the top surface of carrier 20. Release film 22 may be formed of a Light-To-Heat-Conversion (LTHC) coating material. Release film 22 may be applied onto carrier 20 through coating. In accordance with some embodiments of the present disclosure, the LTHC coating material is capable of being decomposed under the heat of light/radiation (such as a laser beam), and hence can release carrier 20 from the structure formed thereon.

In accordance with some embodiments, as also shown in FIG. 1, polymer buffer layer 24 is formed on LTHC coating material 22. Polymer buffer layer 24 may be formed of polybenzoxazole (PBO), polyimide, benzocyclobutene (BCB), or another applicable polymer. Metal seed layer 25 is formed over polymer buffer layer 24, for example, through Physical Vapor Deposition (PVD). Metal seed layer 25 may be in physical contact with polymer buffer layer 24. In accordance with some embodiments of the present disclosure, metal seed layer 25 includes a titanium layer and a copper layer over the titanium layer. In accordance with alternative embodiments of the present disclosure, metal seed layer 25 includes a copper layer contacting buffer dielectric layer 24.

Figure 2:
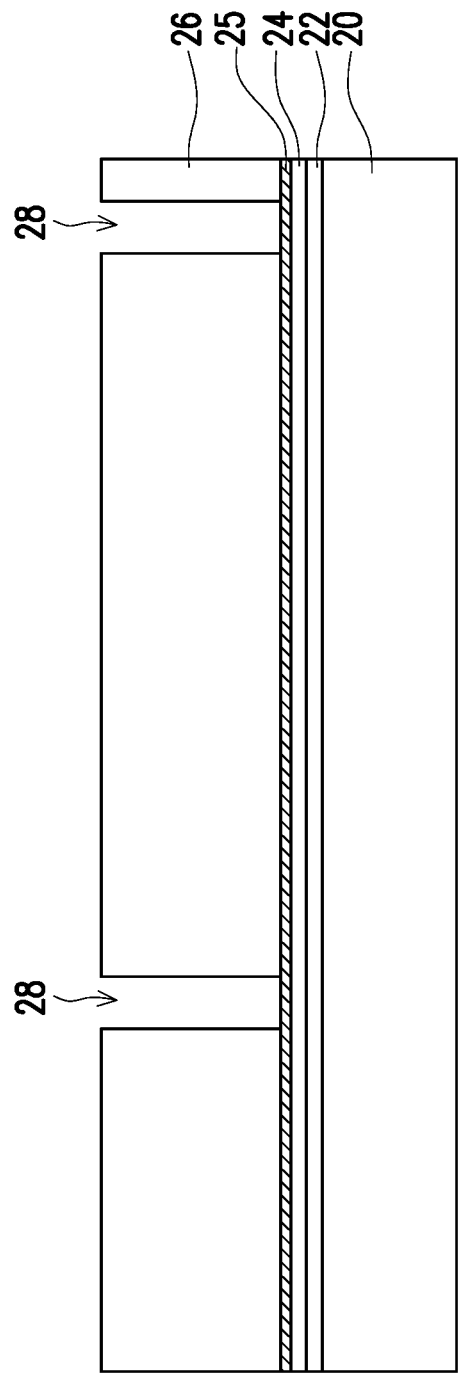
Figure 3:
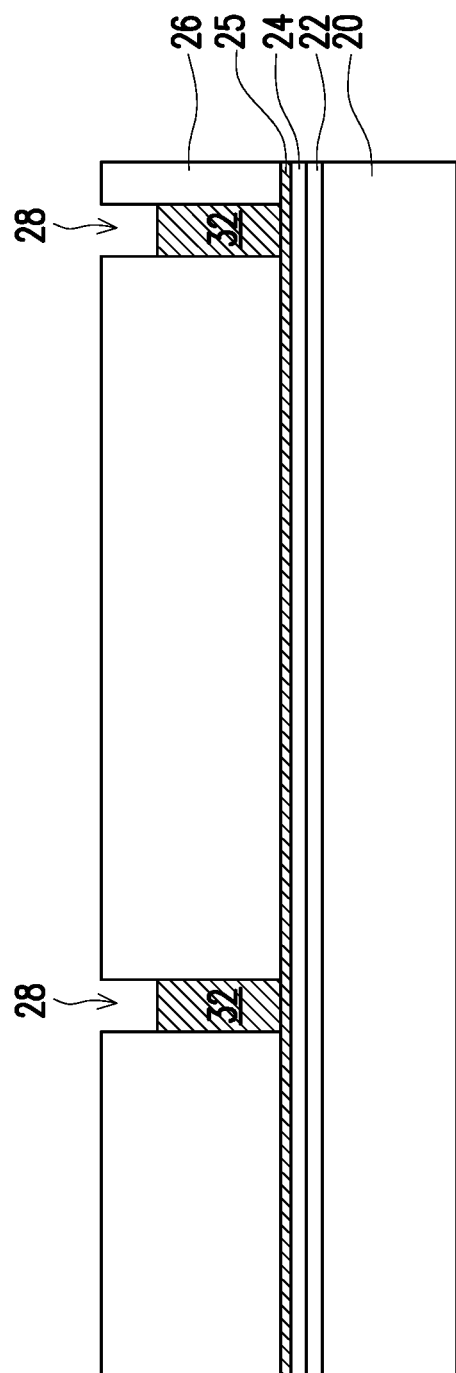
Figure 4:
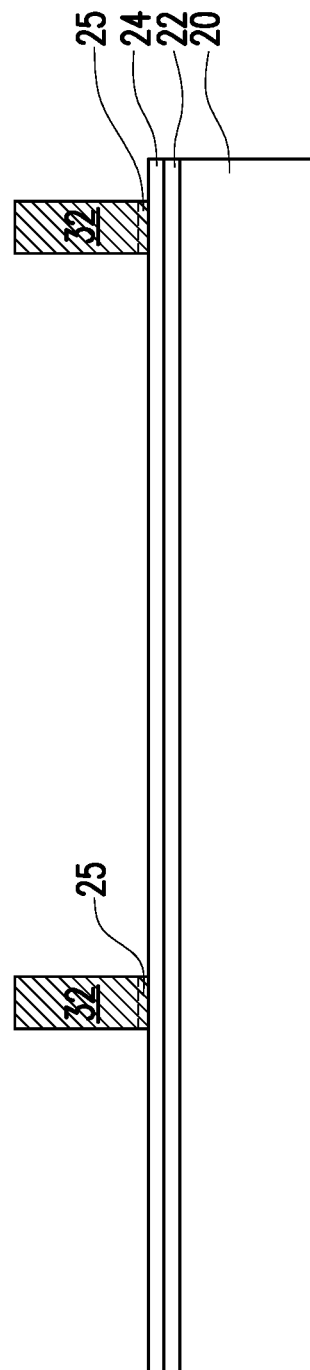

FIGS. 2 through 4 illustrate the formation of metal posts 32 over polymer buffer layer 24. The respective process is illustrated as process 302 in the process flow shown in FIG. 26. Throughout the description, metal posts 32 are alternatively referred to as through-vias 32 since metal posts 32 penetrate through the subsequently dispensed encapsulant.

As shown in FIG. 2, photo resist 26 is formed over metal seed layer 25. A light-exposure process is then performed on photo resist 26 using a photo lithography mask (not shown). After a subsequent development process, openings 28 are formed in photo resist 26, so that some portions of metal seed layer 25 are exposed through openings 28.

Next, as shown in FIG. 3, metal posts 32 are formed by plating a metallic material in openings 28. The plated metallic material may include copper or a copper alloy. The top surfaces of metal posts 32 are lower than the top surface of photo resist 26, so that metal posts 32 are confined by openings 28. Metal posts 32 may have substantially vertical and straight edges. Alternatively, metal posts 32 may have a sand-timer shape in a cross-sectional view, with the middle parts of metal posts 32 being narrower than the respective top parts and bottom parts.

In subsequent steps, photo resist 26 is removed, and the underlying portions of metal seed layer 25 are exposed. The exposed portions of metal seed layer 25 are then removed in an etching step, for example, in a plurality of anisotropic and/or isotropic etching processes. The edges of the remaining seed layer 25 are thus substantially co-terminus with the respective overlying portions of metal posts 32. The resulting metal posts 32 are illustrated in FIG. 4. Throughout the description, the remaining portions of metal seed layer 25 are considered as parts of metal posts 32, and are not illustrated separately. The top-view shapes of metal posts 32 include, and are not limited to, circular shapes, rectangles, hexagons, octagons, and the like. After the formation of metal posts 32, polymer buffer layer 24 is exposed.

Figure 5:
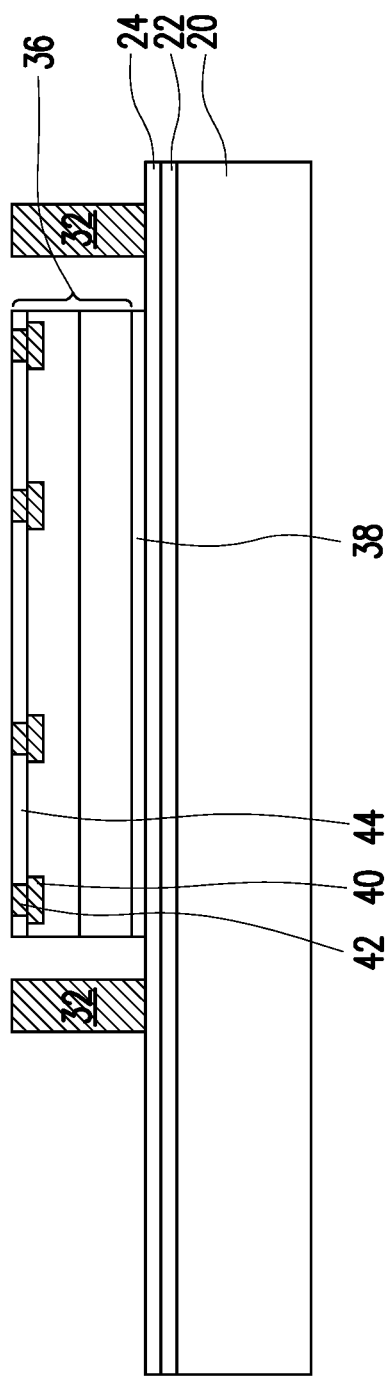

FIG. 5 illustrates the placement and the attachment of device die 36. The respective process is illustrated as process 304 in the process flow shown in FIG. 26. Device die 36 may be attached to polymer buffer layer 24 through Die-Attach Film (DAF) 38, which is an adhesive film. DAF 38 may be pre-attached on device die 36 before device die 36 is placed on polymer buffer layer 24. Device die 36 may include a semiconductor substrate having a back surface (the surface facing down) in physical contact with DAF 38. Device die 36 may include integrated circuit devices (such as active devices, which include transistors, for example, not shown) at the front surface (the surface facing up) of the semiconductor substrate. In accordance with some embodiments of the present disclosure, device die 36 is a logic die, which may be a Central Processing Unit (CPU) die, a Graphic Processing Unit (GPU) die, a mobile application die, a Micro Control Unit (MCU) die, an input-output (TO) die, a BaseBand (BB) die, an Application processor (AP) die, or the like. Since carrier 20 is at wafer level, although one device die 36 is illustrated, a plurality of identical device dies 36 is placed over polymer buffer layer 24, and may be allocated as an array including a plurality of rows and a plurality of columns.

In accordance with some embodiments, metal pillars 42 (such as copper pillars) are pre-formed as portions of device die 36, and metal pillars 42 are electrically coupled to the integrated circuit devices such as transistors (not shown) in device die 36. In accordance with some embodiments of the present disclosure, a dielectric material such as a polymer fills the gaps between neighboring metal pillars 42 to form top dielectric layer 44. Top dielectric layer 44 may also include a portion covering and protecting metal pillars 42. Polymer layer 44 may be formed of PBO, polyimide, or the like in accordance with some embodiments of the present disclosure.

Figure 6:
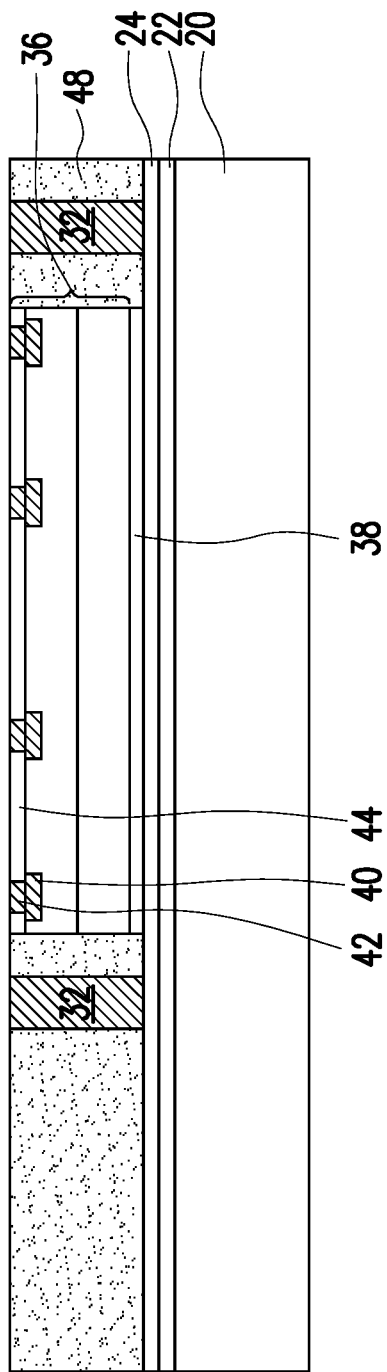

Next, device die 36 and metal posts 32 are encapsulated in encapsulant 48, as shown in FIG. 6. The respective process is illustrated as process 306 in the process flow shown in FIG. 26. Encapsulant 48 fills the gaps between neighboring metal posts 32 and the gaps between metal posts 32 and device die 36. Encapsulant 48 may include a molding compound, a molding underfill, an epoxy, and/or a resin. The top surface of encapsulant 48 is higher than the top ends of metal pillars 42. When formed of molding compound, encapsulant 48 may include a base material, which may be a polymer, a resin, an epoxy, or the like, and filler particles in the base material. The filler particles may be dielectric particles of $SiO_2$, $Al_2O_3$, silica, or the like, and may have spherical shapes. Also, the spherical filler particles may have a plurality of different diameters. Both the filler particles and the base material in encapsulant 48 may be in physical contact with polymer buffer layer 24.

In a subsequent step, a planarization process such as a Chemical Mechanical Polish (CMP) process or a mechanical grinding process is performed to thin encapsulant 48 and dielectric layer 44, until metal posts 32 and metal pillars 42 are exposed. The respective process is also illustrated as process 306 in the process flow shown in FIG. 26. Due to the planarization process, the top ends of metal posts 32 are substantially level (coplanar) with the top surfaces of metal pillars 42, and are substantially coplanar with the top surface of encapsulant 48. Metal posts 32 are alternatively referred to as through-vias 32 in subsequent paragraphs since they penetrate through encapsulant 48.

Figure 7:
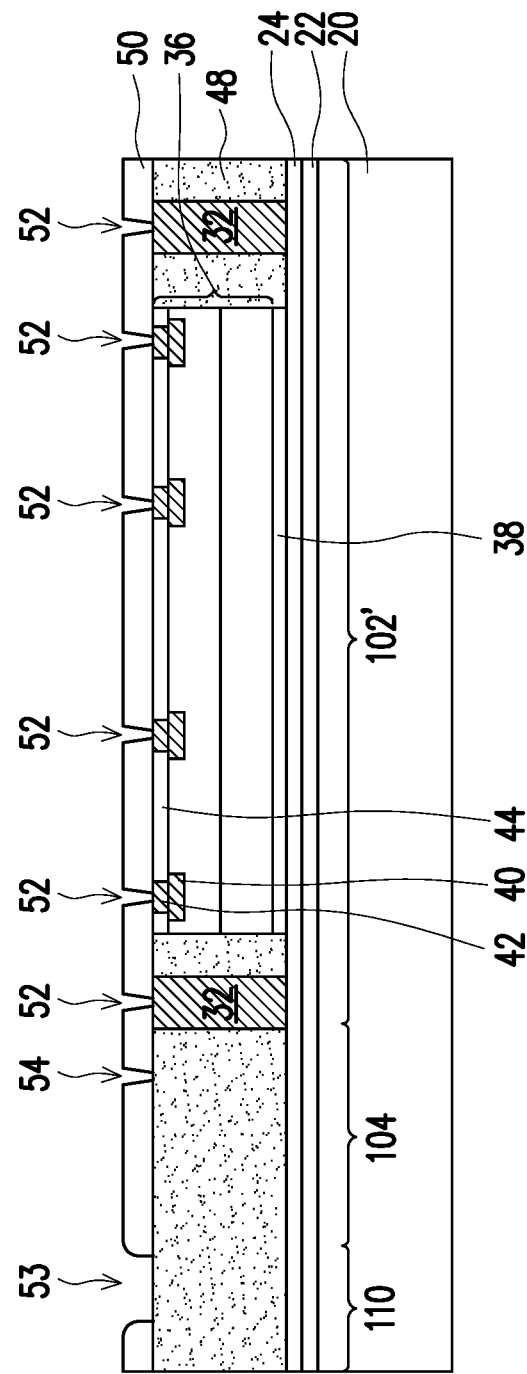
Figure 8:
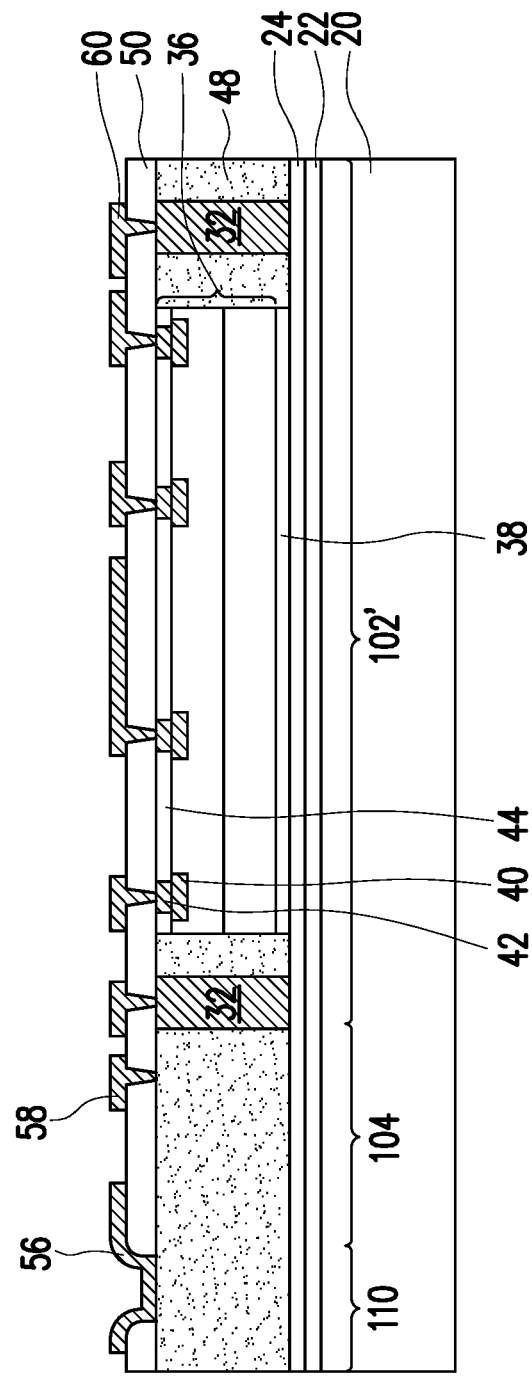

FIGS. 7 through 13 illustrate the formation of a front-side redistribution structure. FIGS. 7 and 8 illustrate the formation of a first layer of Redistribution Lines (RDLs) and the respective dielectric layer. Referring to FIG. 7, dielectric layer 50 is formed. The respective process is illustrated as process 308 in the process flow shown in FIG. 26. In accordance with some embodiments of the present disclosure, dielectric layer 50 is formed of a polymer such as PBO, polyimide, or the like. The formation method includes coating dielectric layer 50 in a flowable form, and then curing dielectric layer 50. In accordance with alternative embodiments of the present disclosure, dielectric layer 50 is formed of an inorganic dielectric material such as silicon nitride, silicon oxide, or the like. The formation method may include coating, Chemical Vapor Deposition (CVD), Atomic Layer Deposition (ALD), Plasma-Enhanced Chemical Vapor Deposition (PECVD), or other applicable deposition methods. Via openings 52 are then formed through patterning dielectric layer 50. The respective process is also illustrated as process 308 in the process flow shown in FIG. 26. In accordance with some embodiments in which dielectric layer 50 is formed of a photo sensitive material such as PBO or polyimide, the formation of openings 52 involves a photo exposure process using a lithography mask (not shown), and a development process. Through-vias 32 and metal pillars 42 are exposed through via openings 52.

Figure 23:
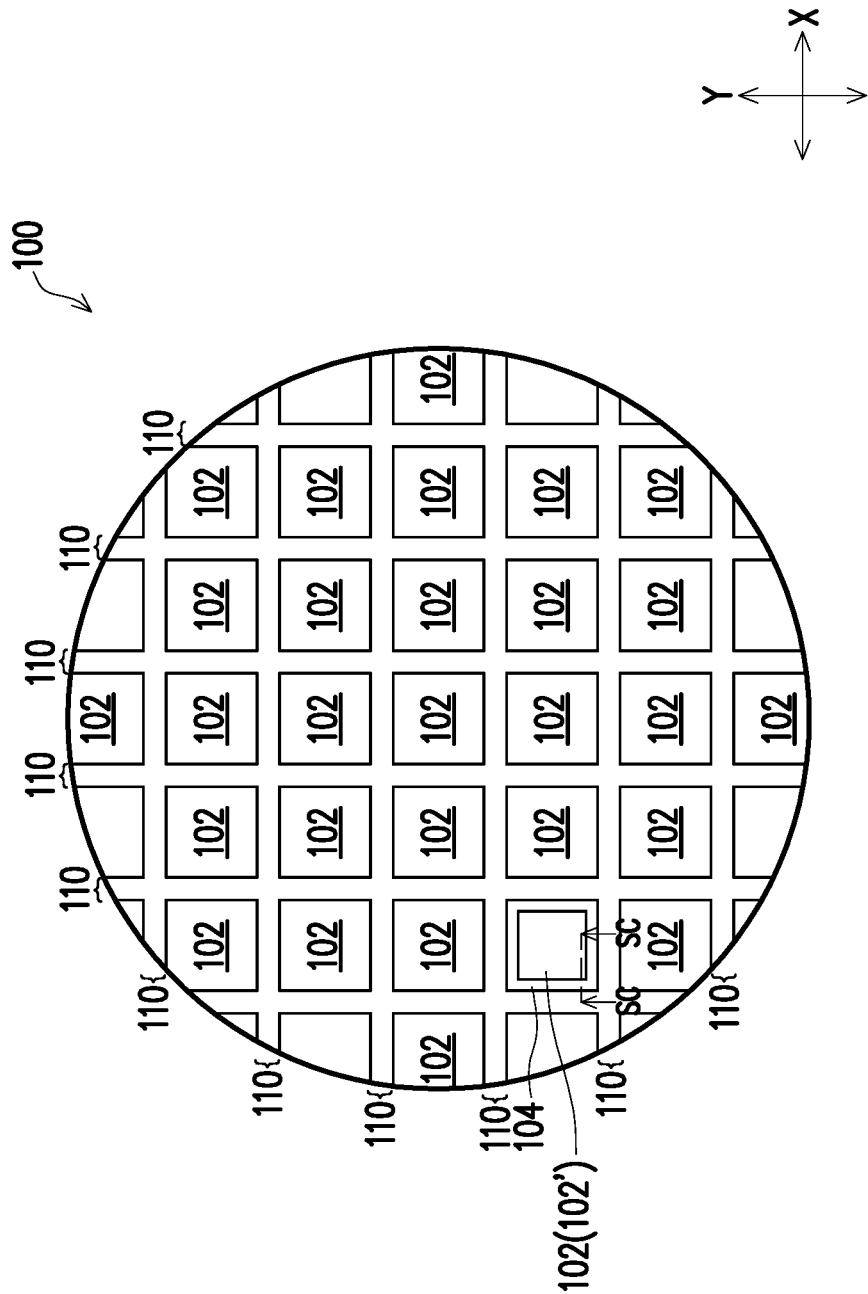
FIG. 23 illustrates a plane view of a reconstructed wafer in accordance with some embodiments.

In addition to via openings 52, opening 53 and possibly opening 54 are also formed. In accordance with some embodiments of the present disclosure, the packaging process is performed at wafer level, and a plurality of device dies 36 are placed on carrier 20, and are packaged in common processes to form a reconstructed wafer 100, which is eventually sawed apart into a plurality of packages 102 as shown in FIG. 23. FIG. 23 illustrates a top view of reconstructed wafer 100 in accordance with some embodiments. A plurality of packages 102, each including device die 36 and the corresponding through-vias 32 and RDLs, etc., are formed as an array in reconstructed wafer 100. Scribe lines no are formed as a grid separating packages 102 apart. As shown in FIG. 7, the region in which through-vias 32 and device die 36 are located marked as inner package region 102', which is surrounded by peripheral region 104. Peripheral region 104 forms a ring-shaped region (in a top view of the respective package) encircling the inner package region 102' of the respective package. Each of the features formed in peripheral region 104 may form a ring encircling the inner package region 102'. An example ring-shaped peripheral region 104 is shown in FIG. 23, and other packages 102 also have the same ring-shaped peripheral regions, although not shown.

Figure 24:
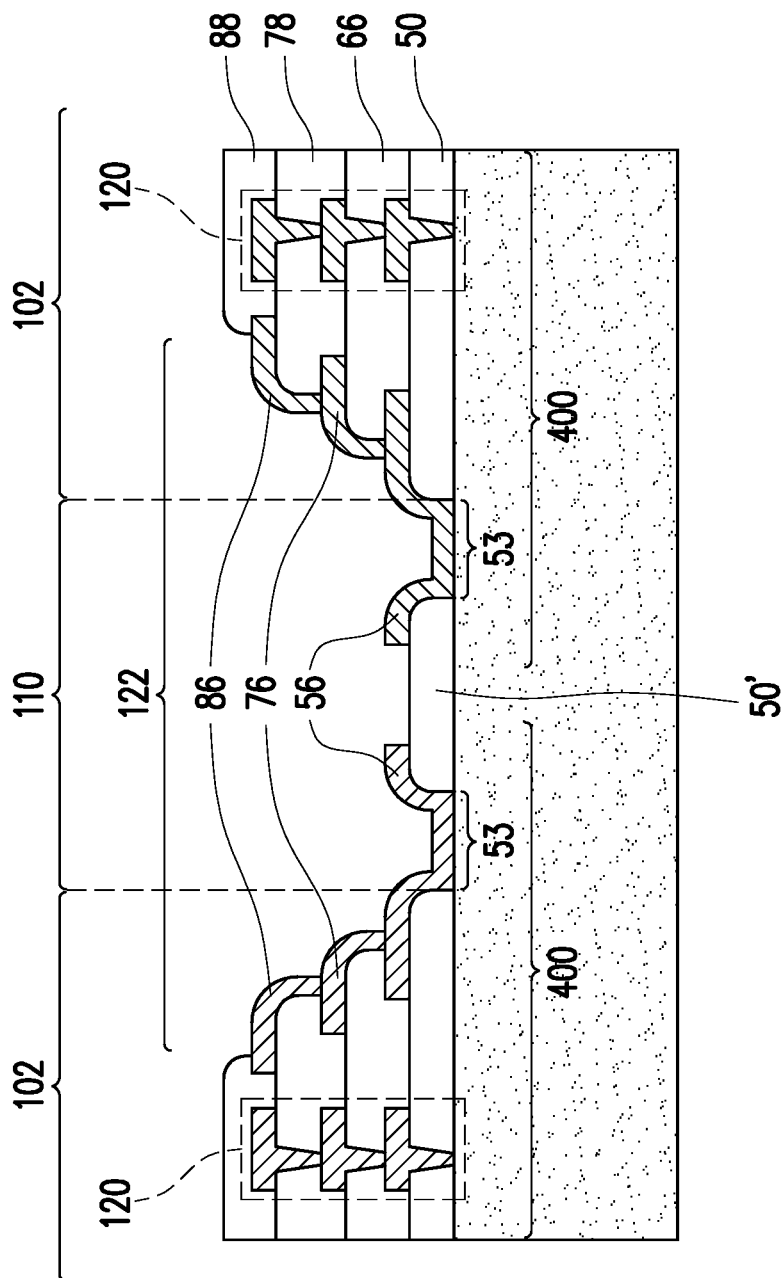
FIG. 24 illustrates the cross-sectional view of a scribe line of a reconstructed wafer in accordance with some embodiments.

In FIG. 7, the left-side scribe line 110 only shows a half (the right half) of the respective scribe line 110, and the left half of the respective scribe line 110 is not shown. The features in the left half of the scribe line 110 may mirror the features that will be formed in subsequent processes. The cross-sectional view in FIG. 7 may be obtained from the reference cross-section SC-SC in FIG. 23 (also shown in FIG. 25). FIG. 24 schematically illustrates the cross-sectional view of an example scribe line 110, with both the left half and the right half being illustrated. The features formed in scribe line no as shown in FIG. 24 will be discussed in subsequent paragraphs.

Referring back to FIG. 7, in accordance with some embodiments of the present disclosure, each of openings 53 is formed to extend into four scribe lines 110 (FIG. 23) that abut the edges of the respective package. Opening 53 thus forms a ring-shaped opening. Accordingly, as can be found from FIG. 23, there will be a plurality of openings 53 (not shown), each forming a ring encircling the respective package region 102'/104. As shown in FIG. 24, a portion 50' of dielectric layer 50 may be left in the center of the respective scribe line 110. Portions 50' in the scribe lines no are connected as a dielectric grid. The dielectric grid separates openings 53 from each other. Furthermore, opening 54 will also form a ring encircling inner package region 102', as can be realized from FIGS. 7 and 23.

Next, referring to FIG. 8, metal ring 56 (also refer to FIG. 24), metal ring 58, and RDLs 60 are formed. The respective process is illustrated as process 310 in the process flow shown in FIG. 26. The formation process may include forming a blanket metal seed layer (not shown) on the structure shown in FIG. 7, forming and patterning a plating mask (such as a photo resist) to reveal some portions of the metal seed layer, plating the metal ring 56, metal ring 58, and RDLs 60 in the openings in the plating mask, removing the plating mask, and etching the portions of the metal seed layer previously covered by the plating mask. In accordance with some embodiments of the present disclosure, the metal seed layer includes a titanium layer and a copper layer over the titanium layer. The formation of the metal seed layer may include, for example, PVD. The metal seed layer extends into openings 52, 53, and 54, and contacts through-vias 32 and metal pillars 42. In accordance with some embodiments of the present disclosure, the plated material comprises copper or a copper alloy. The plating may include electro-chemical plating or electro-less plating.

Each of metal ring 56, metal ring 58, and RDLs 60 may include a via portion in dielectric layer 50, and metal trace portions over dielectric layer 50. The via portions of RDLs 60 are in contact with metal pillars 42 or through-vias 32. The via portions of metal ring 56 and metal ring 58 are in contact with the top surface of encapsulant 48.

Figure 9:
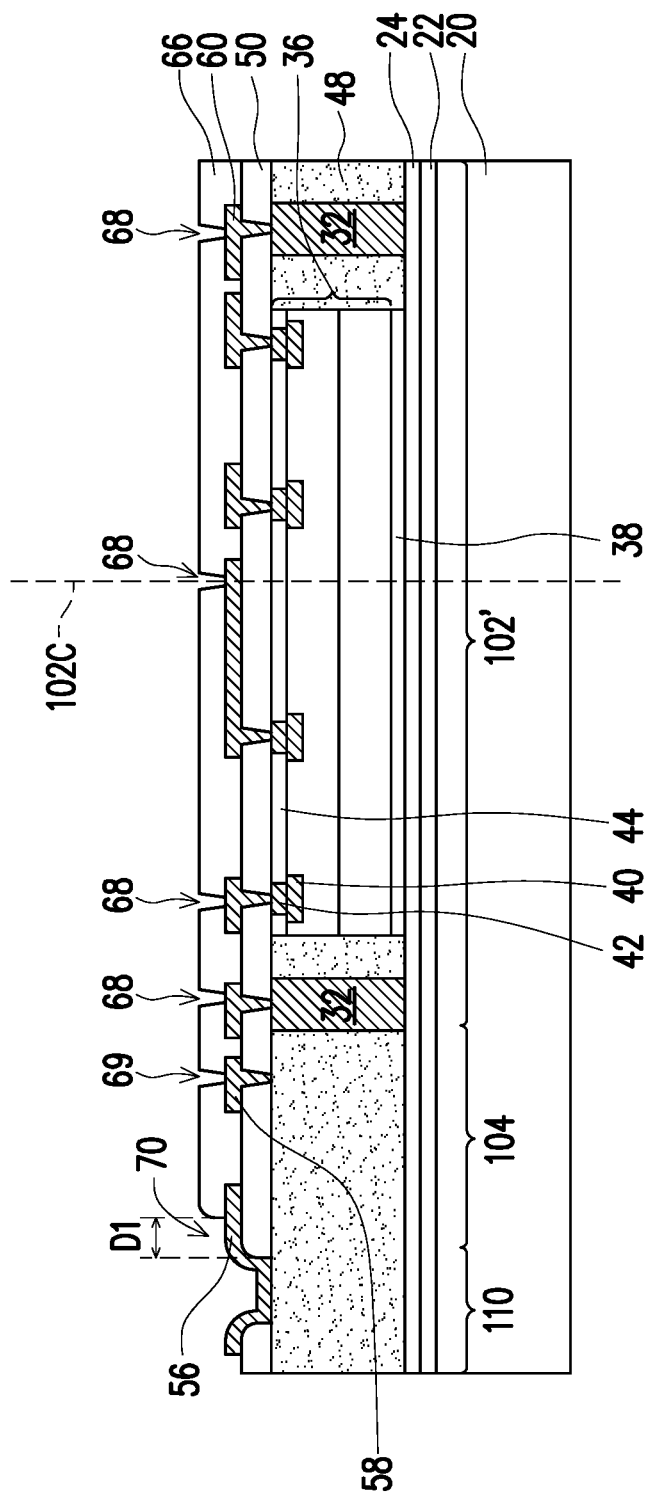

Referring to FIG. 9, dielectric layer 66 is formed. The respective process is illustrated as process 312 in the process flow shown in FIG. 26. Dielectric layer 66 may be formed using a material selected from the same group of candidate materials for forming dielectric layer 50, which may include PBO, polyimide, BCB, or other organic or inorganic materials. Openings 68, 69, and 70 are then formed in dielectric layer 66, for example, through a light-exposure and a development process. Dielectric layer 66 covers RDLs 60. Some portions of RDLs 60, metal ring 58, and metal ring 56 are exposed through openings 68, 69, and 70, respectively. Opening 70 extends into scribe line 110 and peripheral region 104.

In accordance with some embodiments, the edge of dielectric layer 66 is recessed from the edge of dielectric layer 50 (toward the center line 102C of the respective package) by distance D1. In accordance with some embodiments, recessing distance D1 is in the range between about 2 μm and about 15 μm, and may be around 8 μm. The recessing is adopted to improve the process window of the overlay between different dielectric layers. Dielectric layer 66 may cover the edge portions of metal ring 56, with the outer portions of metal ring 56 exposed.

Figure 10:
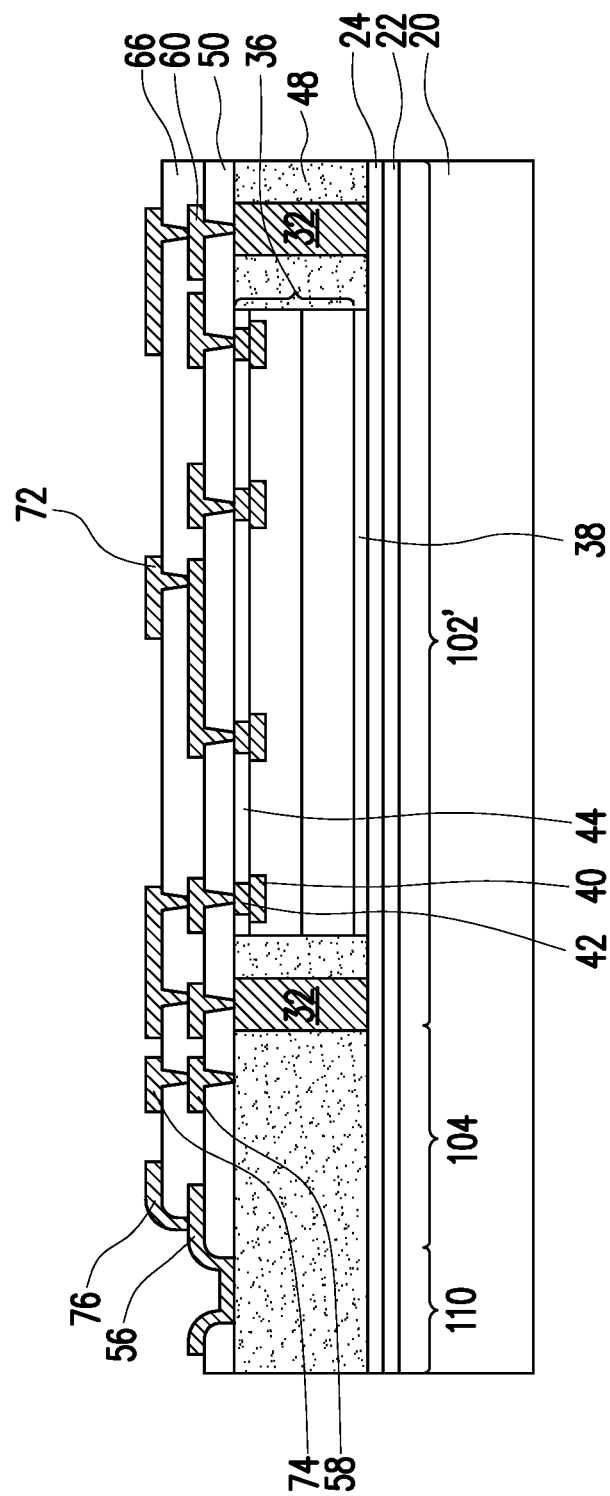

Referring to FIG. 10, RDLs 72, metal ring 74, and metal ring 76 are formed. The respective process is illustrated as process 314 in the process flow shown in FIG. 26. The formation process of RDLs 72, metal ring 74, and metal ring 76 may be essentially the same as the formation of RDLs 60. RDLs 72 also include via portions extending into the via openings in dielectric layer 66 to contact RDLs 60, and metal trace portions directly over dielectric layer 66, and so are metal ring 74 and metal ring 76. The formation of RDLs 72, metal ring 74, and metal ring 76 may be similar to the formation processes of RDLs 60, metal ring 58, and metal ring 56.

Figure 11:
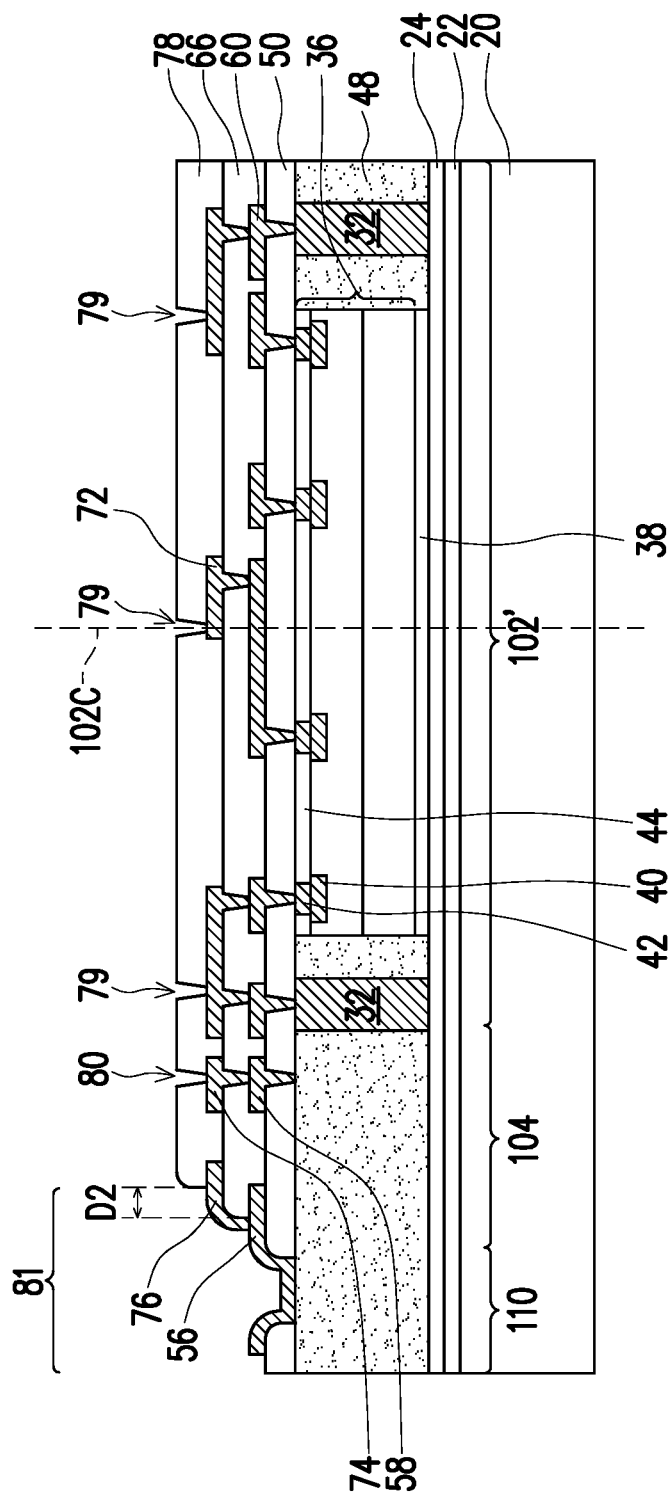

FIG. 11 illustrates the formation of dielectric layer 78 over dielectric layer. The respective process is illustrated as process 316 in the process flow shown in FIG. 26. Next, openings 79, 80, and 81 are formed in dielectric layer 78. Opening 81 extends into scribe line no and peripheral region 104. Dielectric layer 78 may be formed of a material selected from the same group of candidate materials for forming dielectric layers 50 and 66. In accordance with some embodiments, the edge of dielectric layer 78 is recessed toward the center line 102C from the respective edge of dielectric layer 66 by distance D2. In accordance with some embodiments, recessing distance D2 is in the range between about 2 μm and about 15 μm, and may be around 8 μm. Dielectric layer 78 may cover the edge portions of metal ring 76, with the outer portions of metal ring 76 exposed.

Figure 12:
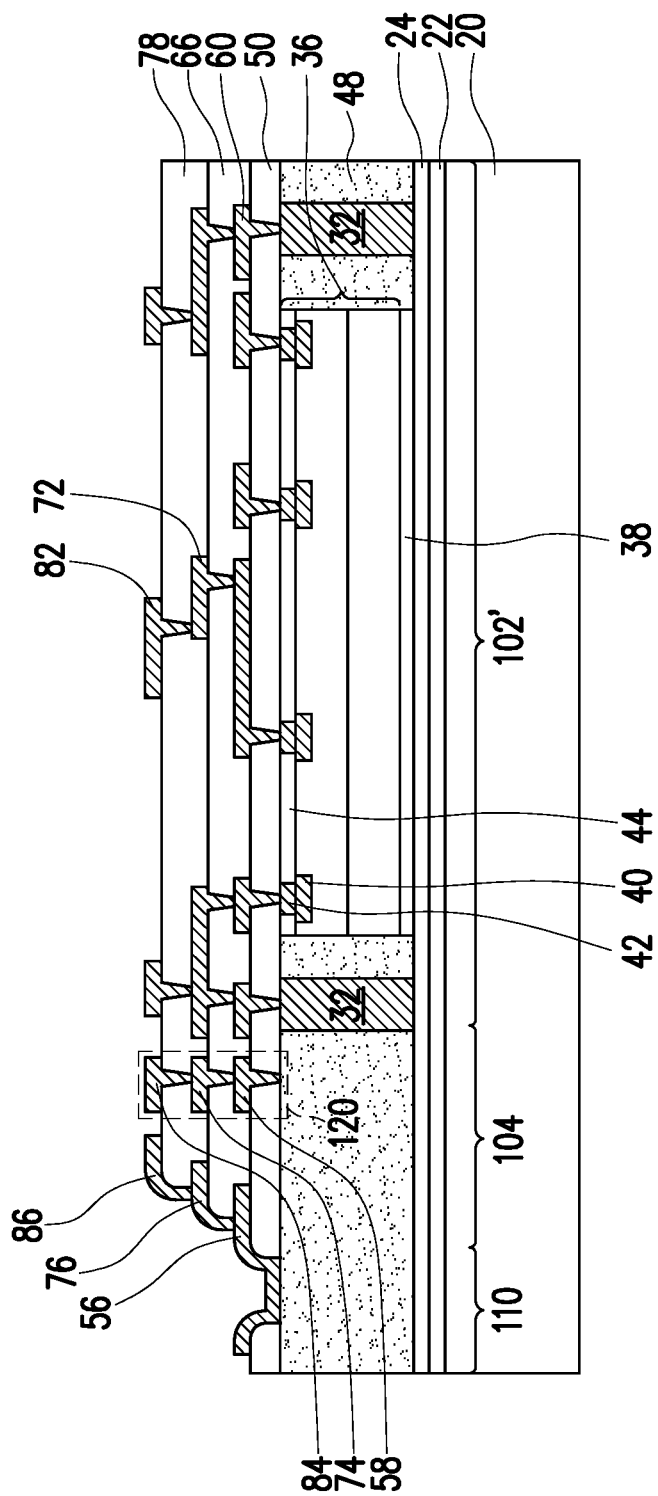

Referring to FIG. 12, RDLs 82, metal ring 84, and metal ring 86 are formed. The respective process is illustrated as process 318 in the process flow shown in FIG. 26. The formation process of RDLs 82, metal ring 84, and metal ring 86 may be essentially the same as the formation of RDLs 60, metal ring 58, and metal ring 56. RDLs 82, metal ring 84, and metal ring 86 may be formed of a metal or a metal alloy including aluminum, copper, tungsten, or alloys thereof. It is appreciated that although three layers of RDLs are formed in the illustrated example embodiments, the package may have other number of RDL layers such as one layer, two layers, or more than three layers.

Figure 13:
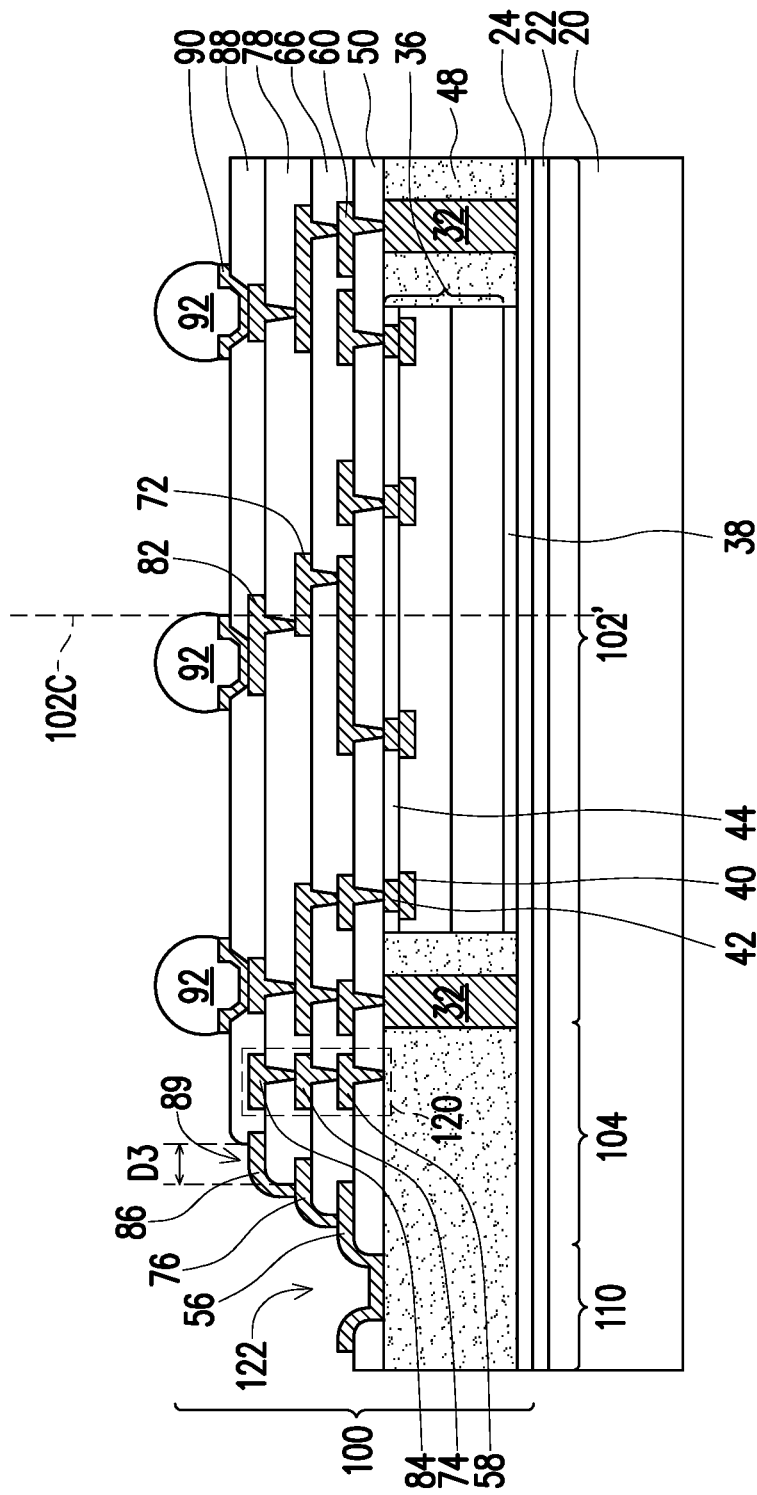

FIG. 13 illustrates the formation of dielectric layer 88. The respective process is illustrated as process 320 in the process flow shown in FIG. 26. Dielectric layer 88 may be formed of a material selected from the same group of candidate materials for forming dielectric layers 50, 66, and 78. For example, dielectric layer 88 may be formed using PBO, polyimide, or BCB. Openings (occupied by UBMs 90 and electrical connectors 92) are formed in dielectric layer 88 to expose the underlying metal pads, which are parts of RDLs 82. Opening 89 is further formed to extend into scribe line no and peripheral region 104. In accordance with some embodiments, the edge of dielectric layer 88 is recessed from the edge of dielectric layer 78 toward the center line 102C by distance D3. In accordance with some embodiments, recessing distance D3 is in the range between about 2 μm and about 15 μm, and may be around 8 μm. Dielectric layer 88 may cover the edge portions of metal ring 86, with the outer portions of metal ring 86 exposed.

FIG. 13 also illustrates the formation of Under-Bump Metallurgies (UBMs) 90 and electrical connectors 92 in accordance with some embodiments. The respective process is illustrated as process 322 in the process flow shown in FIG. 26. In accordance with some embodiment of the present disclosure, UBMs 90 are formed to extend into the openings in dielectric layer 88 in order to contact the metal pads in RDLs 82. UBMs 90 may be formed of nickel, copper, titanium, or multi-layers thereof. In accordance with some embodiments, UBMs 90 include a titanium layer and a copper layer over the titanium layer.

Electrical connectors 92 are then formed in accordance with some embodiments. The formation of electrical connectors 92 may include placing solder balls on the exposed portions of UBMs 90, and then reflowing the solder balls. In accordance with alternative embodiments of the present disclosure, the formation of electrical connectors 92 includes performing a plating step to form solder layers over UBMs 90, and then reflowing the solder layers. Electrical connectors 92 may also include non-solder metal pillars, or metal pillars and solder caps over the non-solder metal pillars, which may also be formed through plating. Throughout the description, the structure including dielectric buffer layer 24 and the overlying structure in combination is referred to as reconstructed wafer 100.

In the structure shown in FIG. 13, seal ring 120 is formed in peripheral region 104, and includes metal rings 58, 74, and 84 that are joined together to form an integrated seal ring. Seal ring 120 encircles the RDLs 60, 72, and 82 therein. In accordance with some embodiments, seal ring 120 is electrically grounded or electrically floating.

Figure 17:
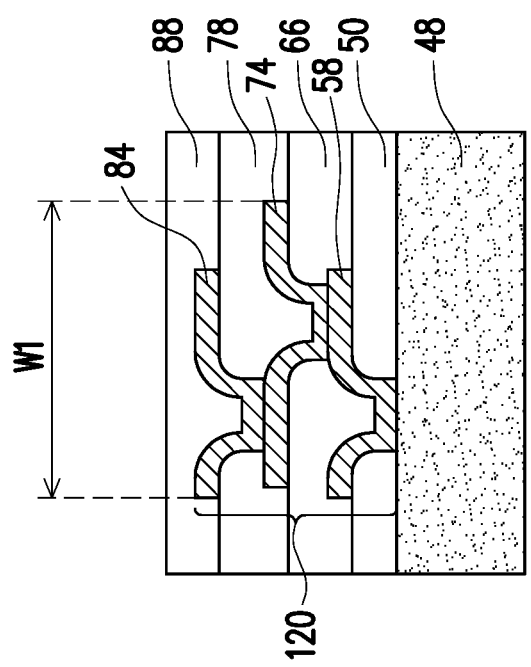
FIG. 17 illustrates the cross-sectional view of a seal ring in accordance with some embodiments.

The seal ring 120 as shown in FIG. 13 is illustrated schematically. FIG. 17 illustrates a more detailed view of seal ring 120, which includes metal rings 58, 74, and 84. The upper ones of metal rings 58, 74, and 84 are stacked on the trace portions of the respective underlying ones of metal rings 58, 74, and 84. Seal ring 120 may occupy a width Wi, which may be in the range between about 30 μm and about 50 μm, for example.

Figure 18:
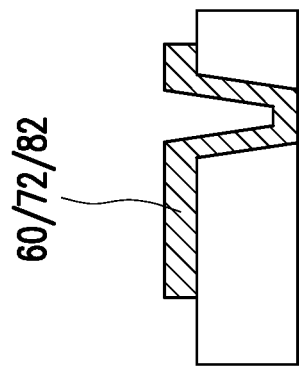
FIG. 18 illustrates the cross-sectional view of a redistribution line in accordance with some embodiments.

FIG. 18 illustrates a more detailed view of an RDL, which may be any of RDLs 60, 72, and 82. The RDL includes a via portion extending down into the underlying dielectric layer, and a trace portion over the respective dielectric layer.

Also, as shown in FIG. 13, the openings in scribe line 110 form air channel 122. Reconstructed wafer 100 includes a plurality of air channels 122 that are interconnected to form a grid. Air channel 122 extends into scribe line 110, and may extend into peripheral region 104. In accordance with some embodiments, the upper portions of air channel 122 are wider than the respective underlying portions. Furthermore, metal rings 56, 76, and 86 are interconnected to form an integrated metal ring, which extends into scribe line 110, and may extend into peripheral region 104.

Figure 14:
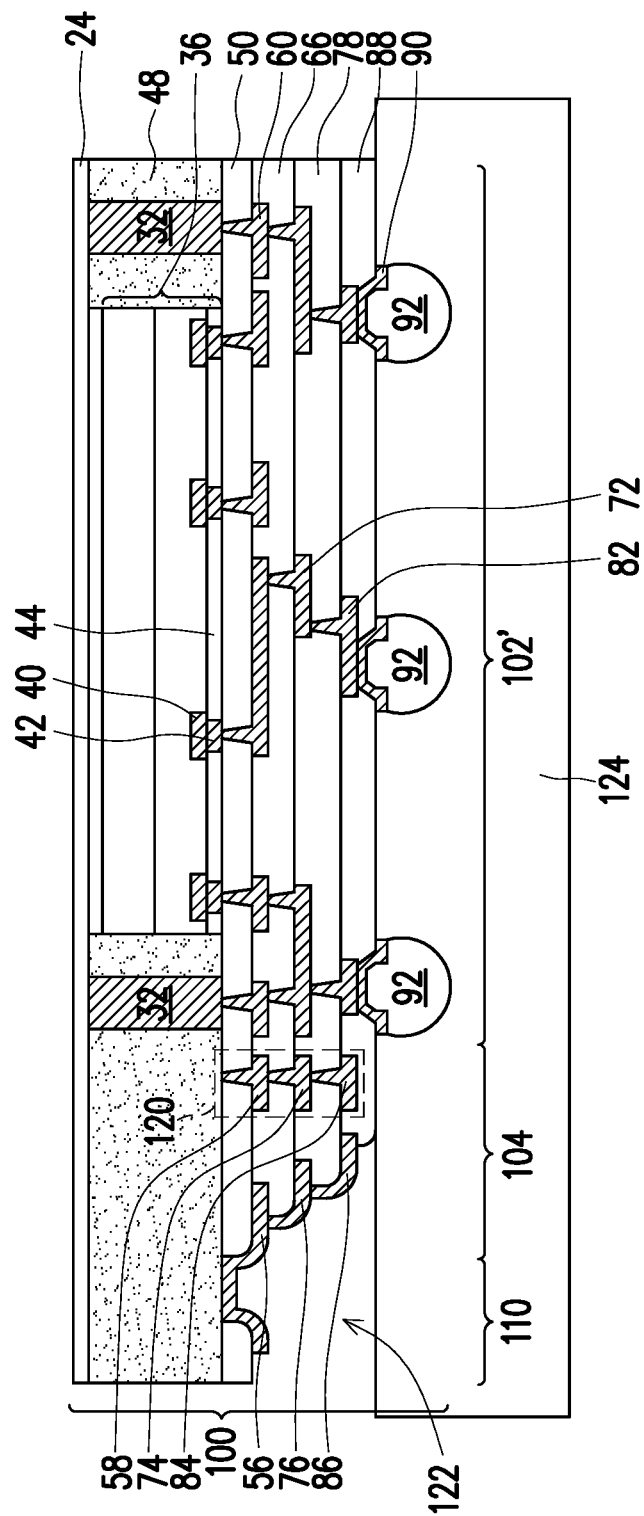

Next, referring to FIG. 14, reconstructed wafer 100 is attached to frame 124, with electrical connectors 92 facing and attached to a tape in frame 124. Reconstructed wafer 100 is then demounted from carrier 20 (FIG. 13), for example, by projecting a laser beam on release film 22. Release film 22 is decomposed under the heat of the laser beam. In FIG. 14, air channels 122 have the function of conducting air out from the space between frame 124 and reconstructed wafer 100. In subsequent processes, plasma may be generated, for example, in some cleaning processes, and the air channels may be used to conduct out the outgassed gases, so that reconstructed wafer 100 does not peel off from frame 124. If air channels are not formed, a pre-grooving process may need to be performed to form the air channels. The pre-grooving process incurs extra manufacturing cost. As a comparison, the air channels formed in accordance with the embodiments of the present disclosure do not incur additional manufacturing cost, and hence may result in the saving of the cost of the pre-grooving process.

Figure 15:
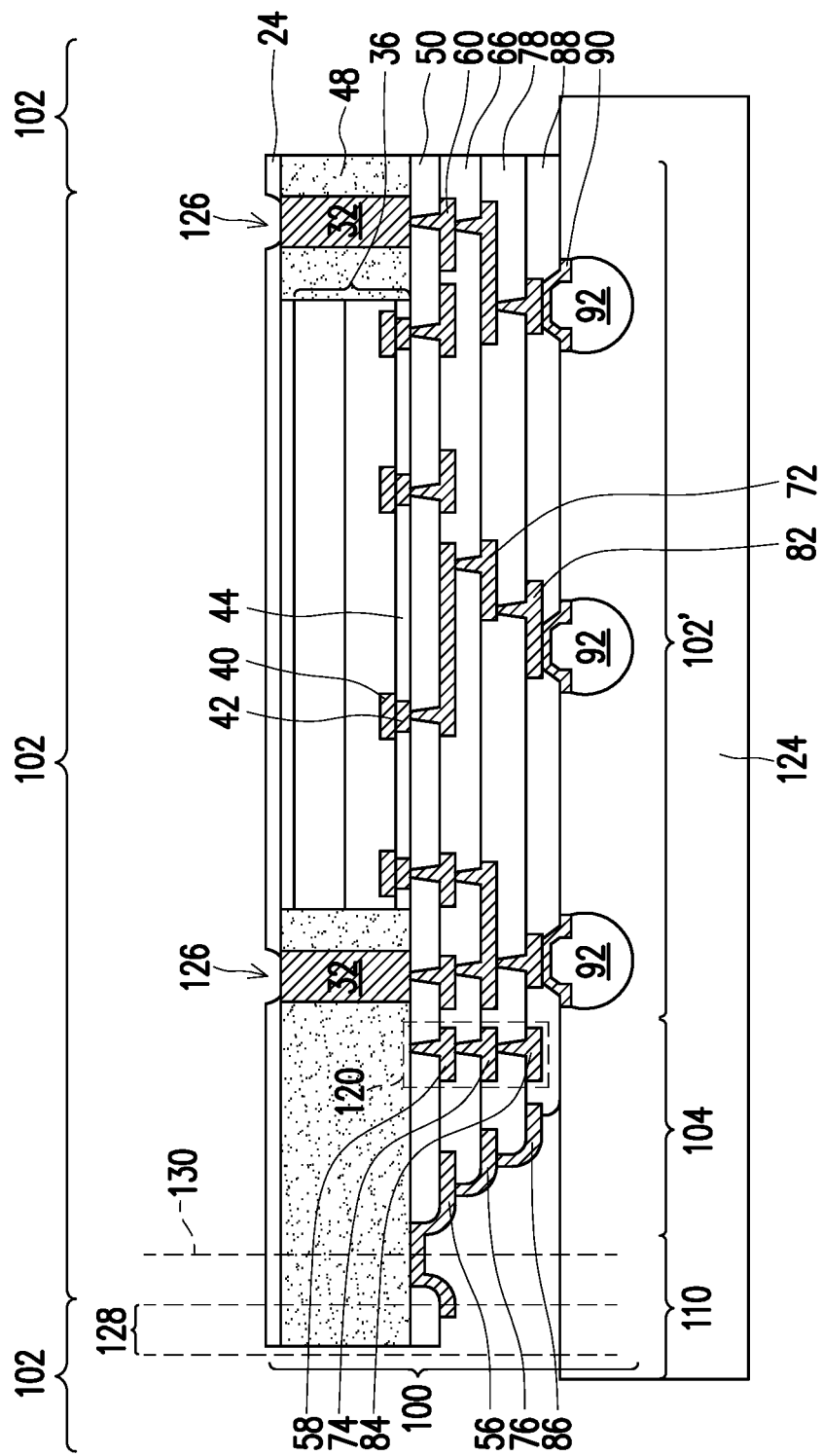

Next, referring to FIG. 15, openings 126 are formed in dielectric buffer layer 24, for example, through laser drilling. When through-vias 32 include titanium layers, and the titanium layers come from the metal seed layer 25 (FIG. 2), the titanium layer may be removed through etching, hence exposing the copper in through-vias 32.

Reconstructed wafer 100 may then be singulated in a die-saw process. The respective process is illustrated as process 324 in the process flow shown in FIG. 26. For example, a blade may saw-through the scribe lines no to separate wafer 100 into a plurality of identical packages 102, each having the structure as illustrated in accordance with some examples. Kerf 128, which is in scribe line 110, is illustrated. Due to process reasons, the kerf 128 may occur in any location in scribe line 110, and may be shifted left or right than illustrated in FIG. 15. For example, dashed line 130 illustrates a possible position of the right edge of kerf 128. Metal ring 56 may be or may not be sawed-through in the die-saw process, and metal rings 76 and 86 may not be sawed-through in the die-saw process.

Figure 25:
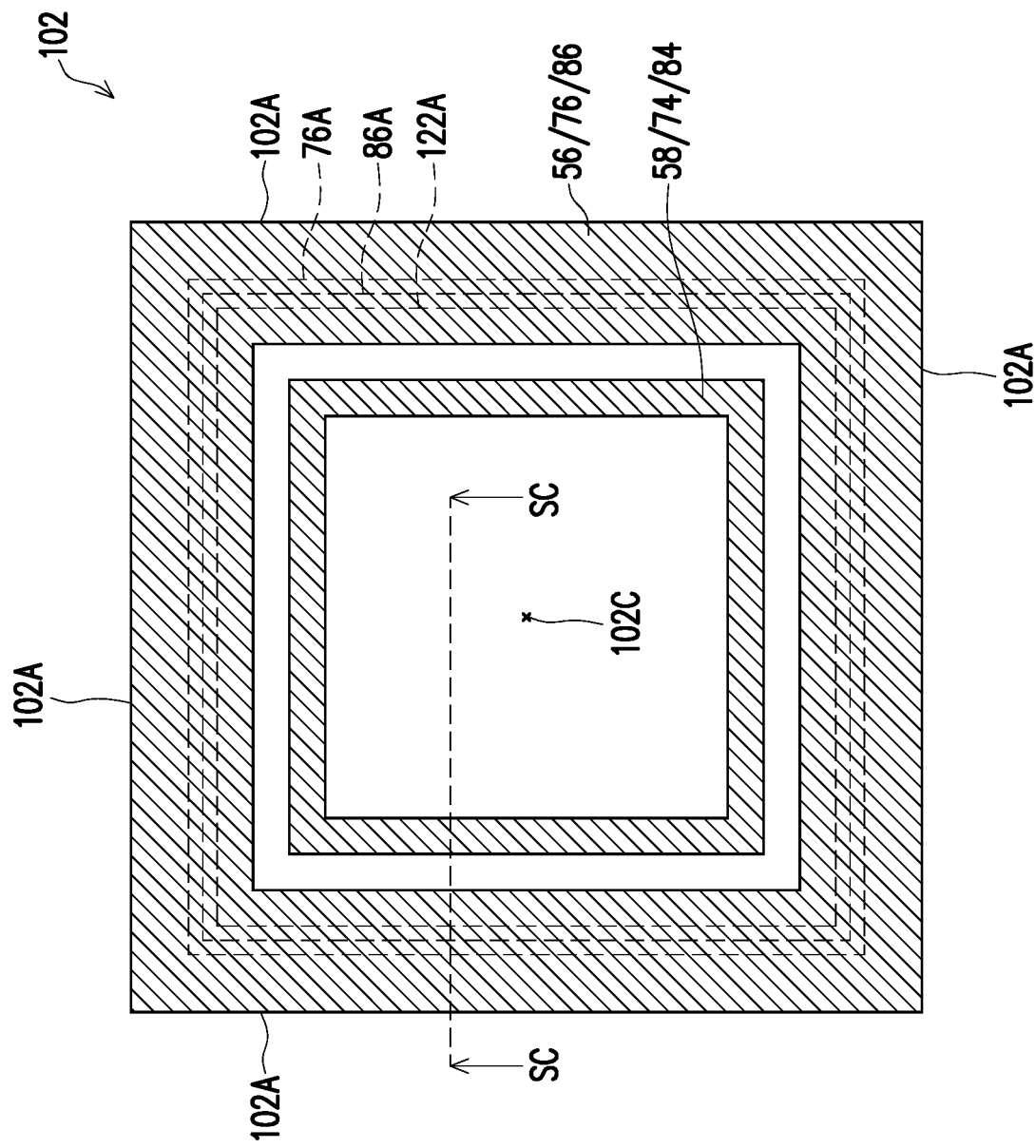
FIG. 25 illustrates a plane view of a package in accordance with some embodiments.

FIG. 25 shows a plane view (a top view or a bottom view) of package 102. In accordance with some embodiments of the present disclosure, each metal ring 56 includes four sides, with each of the four sides parallel to one of the four edges 102A of the respective package 102. One, two, three, or all four sides of the metal ring 56 may be sawed-through. Accordingly, in a resulting package 102, metal ring 56 may extend to one, two, three, or four of the edges 102A. Metal rings 76 and 86, on the other hand, are not sawed in the die-saw process. Metal rings 56, 76, and 86 may be joined to form an integrated metal ring, which may be electrically grounded or electrically floating. Dashed rectangle 122A illustrates the inner boundaries of air channel 122, wherein air channel 122 also forms a ring extending from dashed rectangle 122A to the respective edges 102A of package 102. Dashed rectangles 76A and 86A illustrate the positions of the outer boundaries of metal rings 76 and 86, respectively. The center of package 102 is at 102C.

Figure 16:
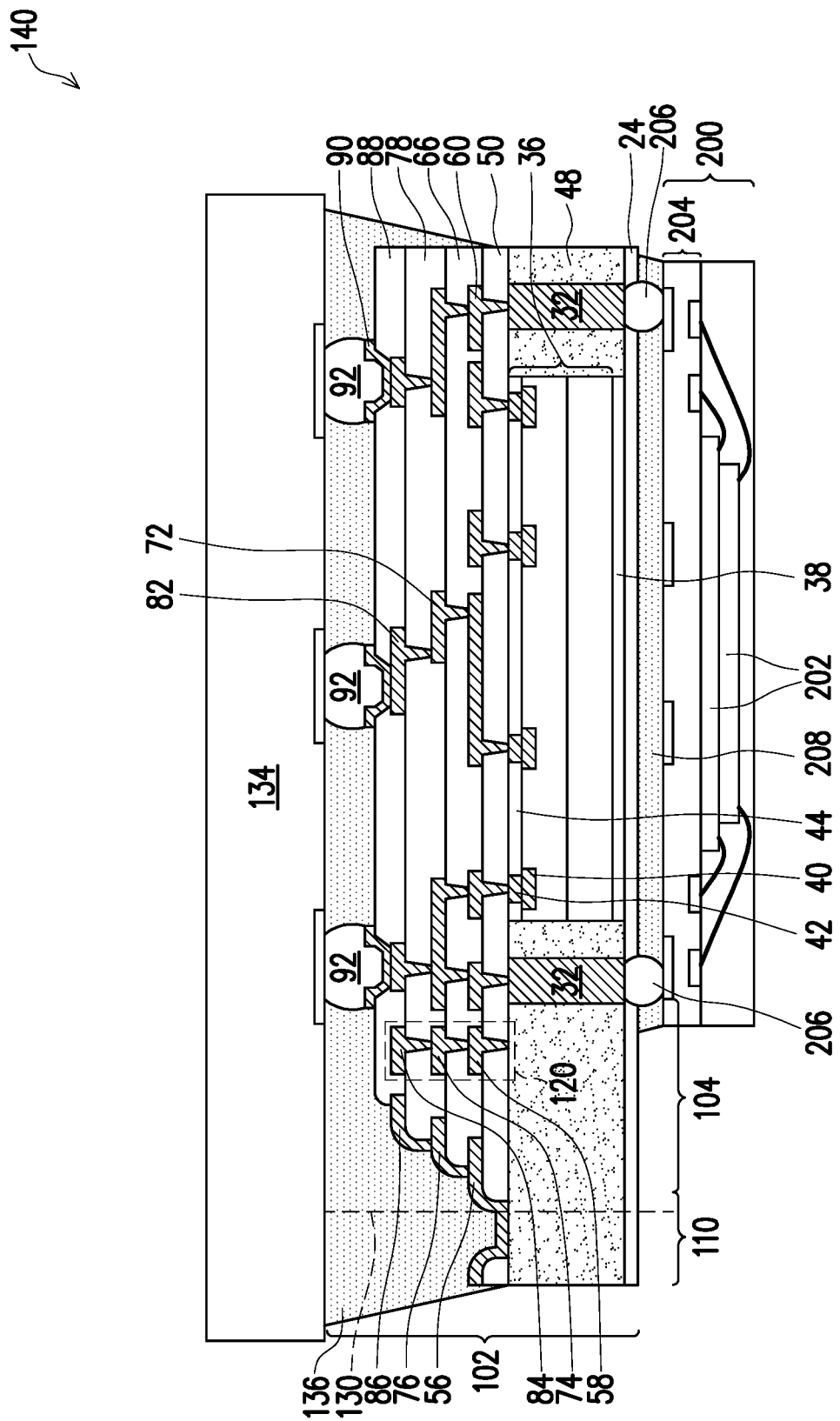

FIG. 16 illustrates the bonding of package 102 to package component 134 through solder regions 92. In accordance with some embodiments of the present disclosure, package component 134 is a package substrate, which may be a coreless substrate or a substrate having a core. In accordance with other embodiments, package component 134 is a printed circuit board, a package, or the like. Underfill 136 may be dispensed between package 102 and package component 134. Underfill 136 may include a base material, which may be a polymer, a resin, an epoxy, or the like, and filler particles in the base material. The filler particles may be dielectric particles of $SiO_2$, $Al_2O_3$, silica, or the like, and may have spherical shapes with the same or different diameters. Package 102 may also be bonded to package 200 through solder regions 206. In accordance with some embodiments, package 200 includes device dies 202 and substrate 204. Dies 202 may be memory dies such as Dynamic Random Access Memory (DRAM) dies. Underfill 208 may be disposed between package 102 and package 200. The resulting package in FIG. 16 is referred to as package 140.

FIGS. 19 through 22 illustrate the cross-sectional views of packages 140 in accordance with some embodiments of the present disclosure. Unless specified otherwise, the materials and the formation methods of the components in these embodiments are essentially the same as the like components, which are denoted by like reference numerals in the embodiments shown in FIGS. 1 through 16. The details regarding the formation process and the materials of the components shown in FIGS. 19 through 22 may thus be found in the discussion of the embodiments shown in FIGS. 1 through 16.

Figure 19:
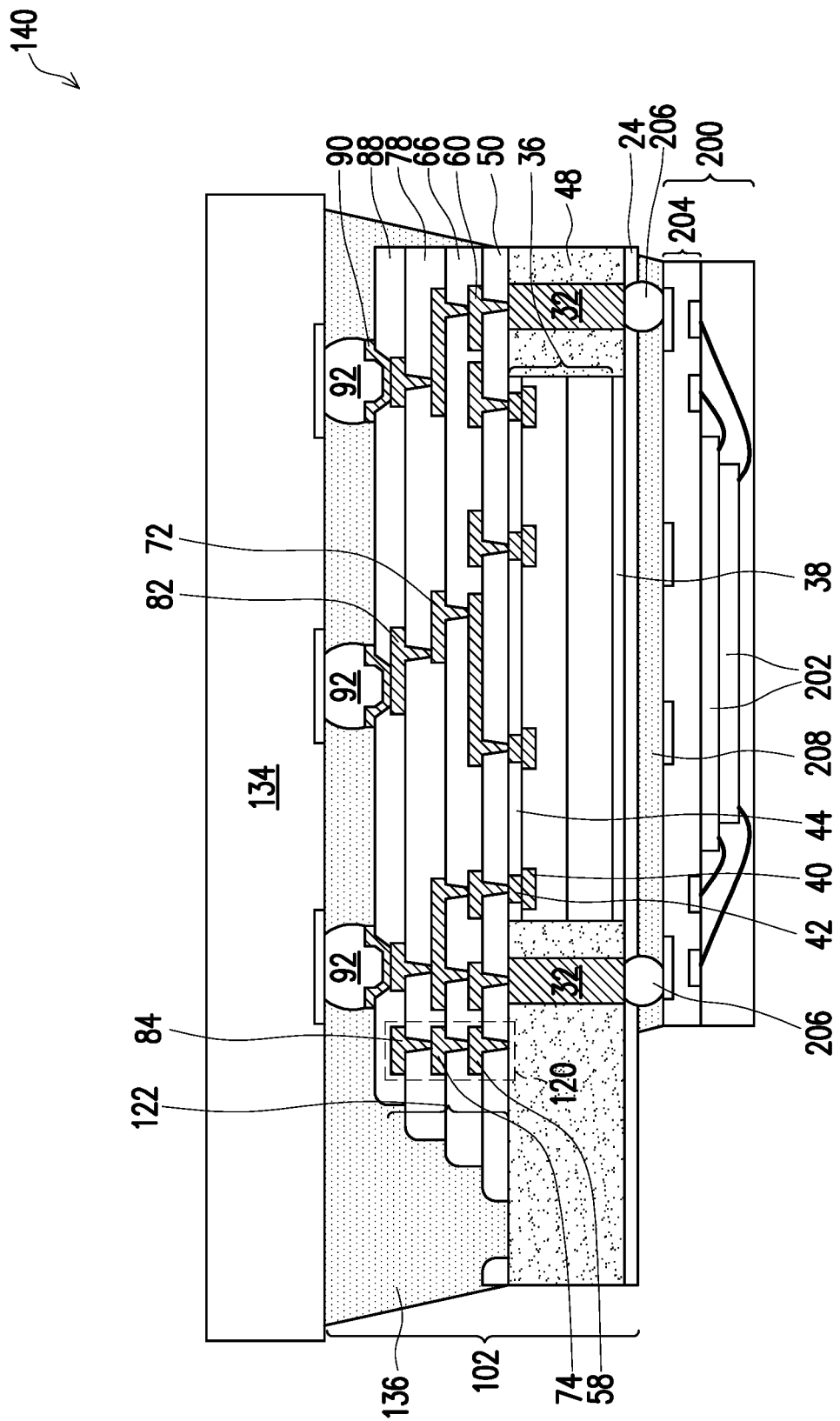
FIGS. 19 through 22 illustrate the cross-sectional views of some packages in accordance with some embodiments.

FIG. 19 illustrates package 140 in accordance with some embodiments. These embodiments are similar to what are shown in FIG. 16, except that metal rings 56, 76, and 86 (FIG. 16) are not formed. Accordingly, dielectric layers 66, 78, and 88 are exposed to the air channel 122, which is filled by underfill 136. Underfill 136 may also be in contact with encapsulant 48.

Figure 20:
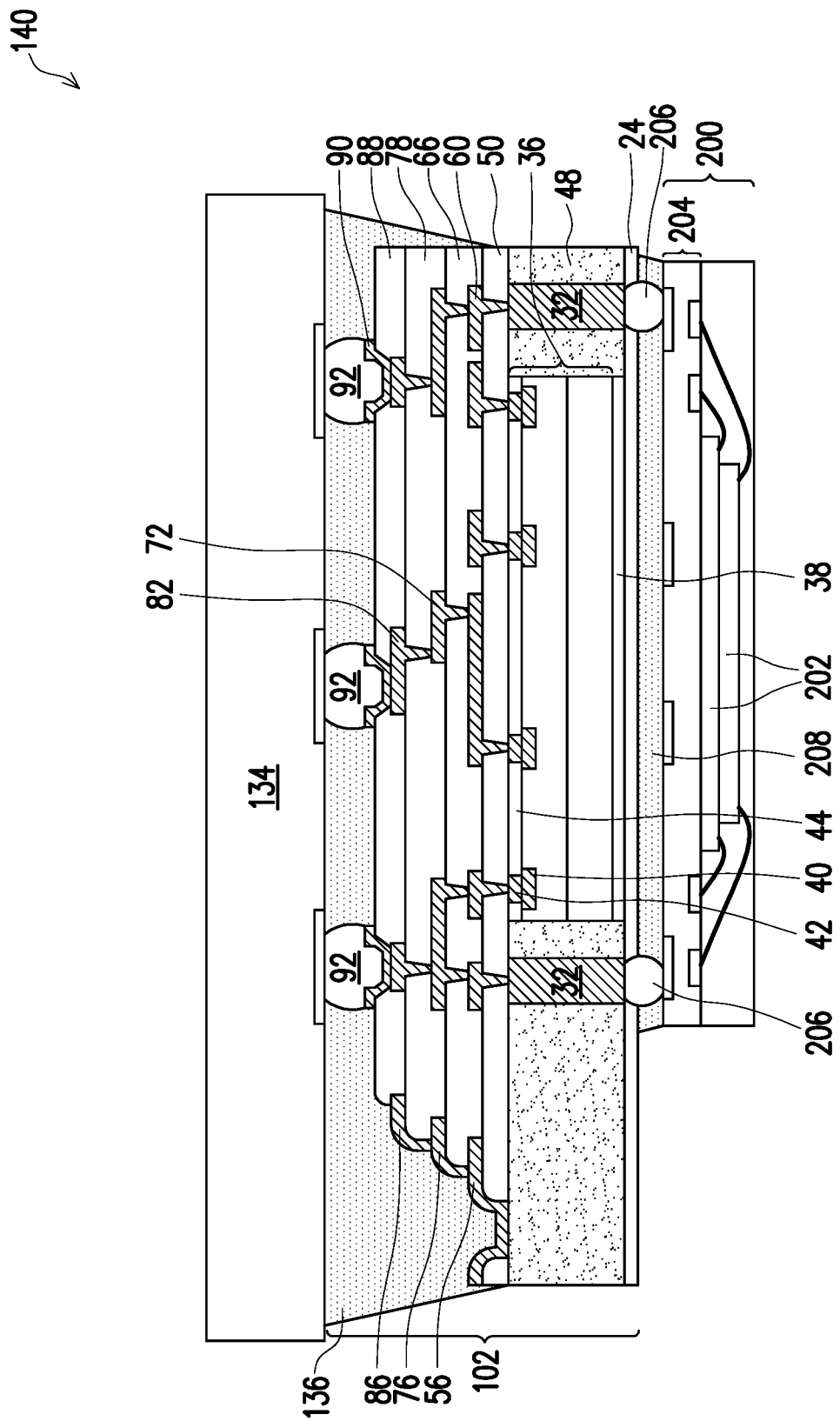

FIG. 20 illustrates package 140 in accordance with some embodiments. These embodiments are similar to the embodiments shown in FIG. 16, except that seal ring 120 (FIG. 16) is not formed. Metal rings 56, 76, and 86 are interconnected, and hence act as a seal ring. The seal ring formed of metal rings 56, 76, and 86 may be electrically grounded or electrically floating. Since seal ring 120 is not formed, the chip area used for forming seal ring 120 is saved.

Figure 21:
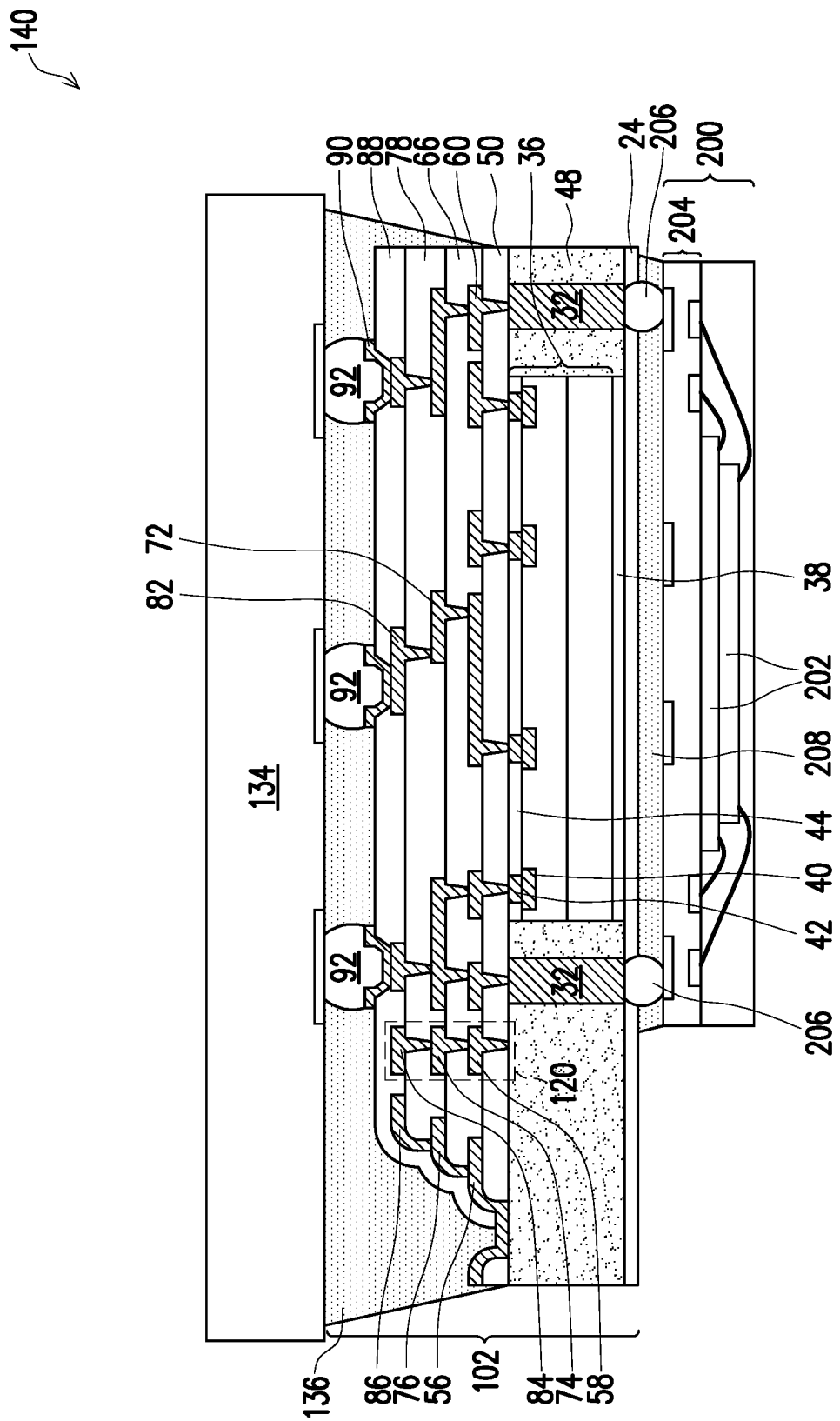

FIG. 21 illustrates package 140 in accordance with some embodiments. These embodiments are similar to the embodiments shown in FIG. 16, except that dielectric layer 88 extends to cover, and contact, metal rings 56 and 76 also.

Figure 22:
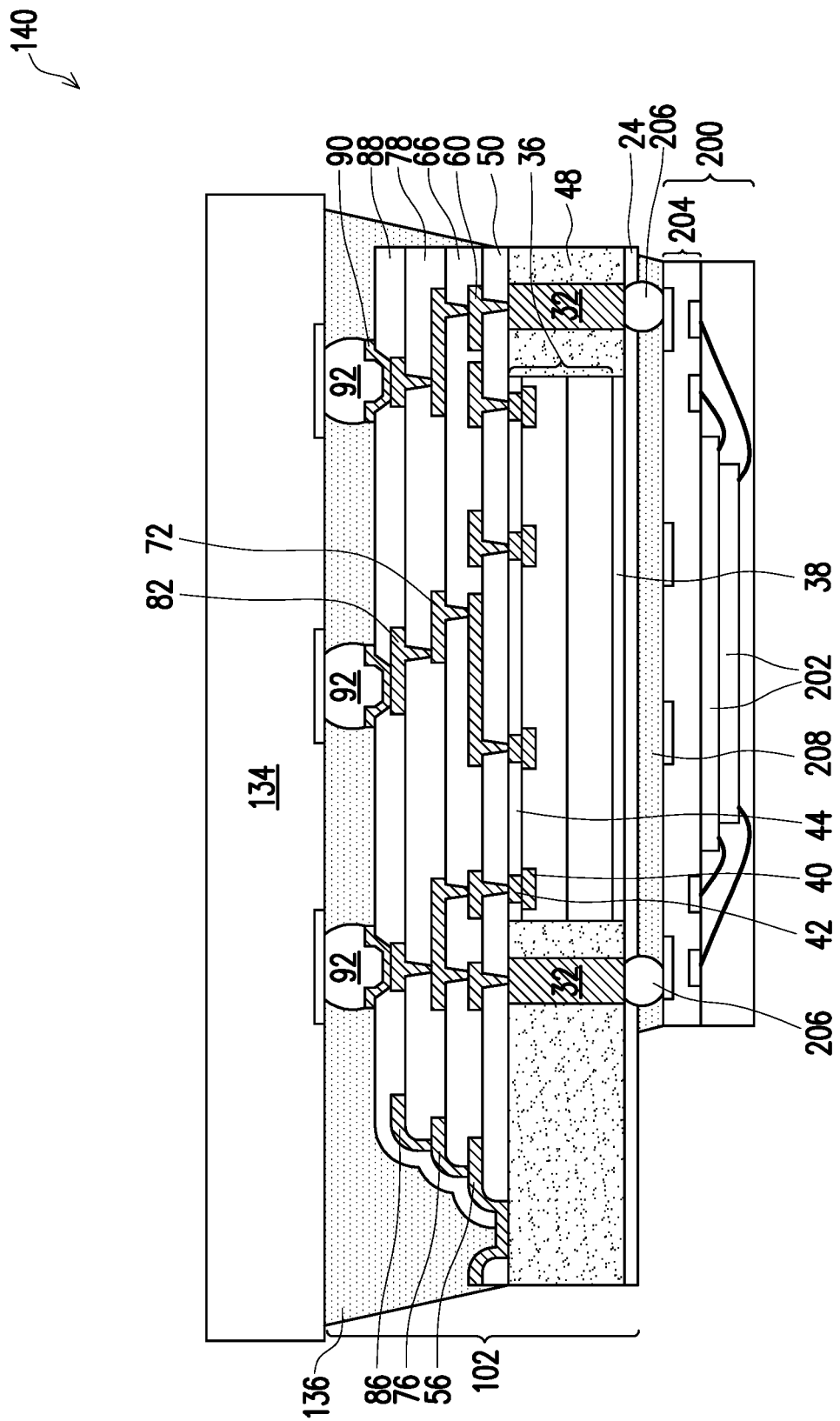

FIG. 22 illustrates package 140 in accordance with some embodiments. These embodiments are similar to the embodiments shown in FIG. 21, except that seal ring 120 (FIG. 21) is not formed. Metal rings 56, 76, and 86 are interconnected, and hence act as a seal ring. The seal ring formed of metal rings 56, 76, and 86 may be electrically grounded or electrically floating. Since seal ring 120 is not formed, the chip area used for forming seal ring 120 is saved.

In above-illustrated embodiments, some processes and features are discussed in accordance with some embodiments of the present disclosure. Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The embodiments of the present disclosure have some advantageous features. By utilizing the existing dielectric formation processes and RDL formation processes to form air channels, the manufacturing cost for forming the air channels (for example, pre-grooving using laser) is saved. Since seal rings may be formed by forming connected metal rings on edge portions of the packages, the chip area that are otherwise reserved for forming the seal rings may also be saved.

In accordance with some embodiments of the present disclosure, a method includes encapsulating a first device die and a second device die in an encapsulant; forming a first dielectric layer over the first device die, the second device die, and the encapsulant; patterning the first dielectric layer to form first openings and a second opening, wherein conductive features of the first device die and the second device die are exposed to the first openings, and wherein the second opening extends into a scribe line between the first device die and the second device die; forming first redistribution lines extending into the first openings to electrically couple to the first device die and the second device die; forming a second dielectric layer over the first redistribution lines; patterning the second dielectric layer to form third openings and a fourth opening, wherein portions of the first redistribution lines are exposed to the third openings, and the fourth opening extends into the scribe line; forming second redistribution line s extending into the third openings to electrically couple to the first redistribution lines; and performing a die-saw process to separate the first device die and the second device die into a first package and a second package, respectively, wherein a kerf of the die-saw process passes through the scribe line. In an embodiment, the fourth opening is wider than the second opening. In an embodiment, the first device die and the second device die form parts of a reconstructed wafer, and the method further comprises attaching the reconstructed wafer to a frame, with the second opening and the fourth opening having at least portions remaining to form a part of an air channel, and the air channel is between the encapsulant and the frame. In an embodiment, the method further comprises, in a same process for forming the first redistribution lines, forming a first metal ring extending into the scribe line, wherein the first metal ring encircles an inner portion of the first package. In an embodiment, in the die-saw process, the first metal ring is sawed-through. In an embodiment, after the die-saw process, the first metal ring forms a part of stacked metal rings encircling the inner portion of the first package. In an embodiment, the method further comprises, in a same process for forming the second redistribution lines, forming a second metal ring joining to the first metal ring, wherein an entirety of the second metal ring is outside the scribe line. In an embodiment, the method further comprises bonding the first package to a package component; and disposing an underfill into a gap between the first package and the package component, wherein the underfill is disposed into at least a portion of the second opening and the fourth opening.

In accordance with some embodiments of the present disclosure, a method includes forming a reconstructed wafer comprising encapsulating a device die in an encapsulant; forming a first dielectric layer over the device die and the encapsulant; forming a first plurality of redistribution lines extending into the first dielectric layer to electrically couple to the device die; and forming a first metal ring in a common process for forming the first plurality of redistribution lines, wherein the first metal ring encircles the first plurality of redistribution lines, and the first metal ring extends into scribe lines of the reconstructed wafer; and performing a die-saw process along scribe lines of the reconstructed wafer to separate a package from the reconstructed wafer, wherein the package comprises the device die and at least a portion of the first metal ring. In an embodiment, in the die-saw process, the first metal ring is sawed-through. In an embodiment, the method further comprises forming a second dielectric layer over the first dielectric layer and the first plurality of redistribution lines; forming a second plurality of redistribution lines extending into the second dielectric layer to join to the first plurality of redistribution lines; and forming a second metal ring in a same process for forming the second plurality of redistribution lines, wherein the second metal ring encircles the second plurality of redistribution lines. In an embodiment, in the die-saw process, the second metal ring is not sawed-through. In an embodiment, the second metal ring is joined to the first metal ring to form parts of an integrated seal ring. In an embodiment, the package is free from seal rings between the integrated seal ring and the first plurality of redistribution lines. In an embodiment, the method further comprises forming an additional seal ring extending into the first dielectric layer, wherein the first metal ring encircles the additional seal ring.

In accordance with some embodiments of the present disclosure, a package of integrated circuit devices includes a device die; an encapsulant encapsulating the device die therein; a plurality of dielectric layers overlying the encapsulant, wherein edges of the plurality of dielectric layers are spaced apart from edges of the package, and edges of upper layers of the plurality of dielectric layers are recessed more toward a center of the package than edges of respective lower layers of the plurality of dielectric layers; and a plurality of redistribution lines extending into the plurality of dielectric layers to electrically couple to the device die. In an embodiment, the package further comprises a metal ring, wherein the metal ring encircles the plurality of dielectric layers and the plurality of redistribution lines. In an embodiment, the metal ring comprises a bottom ring extending to at least an edge of the package; and an upper ring over and joined to the bottom ring, wherein the upper ring is spaced apart from edges of the package. In an embodiment, the package further comprises an additional seal ring spaced apart from the edges of the plurality of dielectric layers, wherein the metal ring encircles the additional seal ring. In an embodiment, the package further comprises an underfill encircling, and at same levels as, the plurality of dielectric layers, wherein the underfill overlaps edge portions of the encapsulant.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package comprising:
a device die;
an encapsulant encapsulating the device die therein;
a plurality of dielectric layers overlying the encapsulant, wherein outmost edges of the plurality of dielectric layers are spaced apart from respective nearest edges of the package;
a plurality of metal rings, each contacting a sidewall of one of the plurality of dielectric layers, wherein upper ones of the plurality of metal rings are joined to respective lower ones of the plurality of metal rings, and wherein the upper ones of the plurality of metal rings are increasingly farther away from the respective nearest edges of the package than the lower ones of the plurality of metal rings; and
a plurality of redistribution lines in the plurality of dielectric layers to electrically couple to the device die.

2. The package of claim 1 further comprising an underfill contacting at least one of the plurality of metal rings.

3. The package of claim 2, wherein the underfill is in physical contact with each of the plurality of metal rings.

4. The package of claim 2, wherein a portion of the underfill extends into the plurality of dielectric layers, and the portion of the underfill has upper parts wider than respective lower parts.

5. The package of claim 1 further comprising an underfill, wherein the underfill is separated from the plurality of metal rings by a portion of a top layer in the plurality of dielectric layers.

6. The package of claim 5, wherein the portion of the top layer in the plurality of dielectric layers contacts a bottom ring of the plurality of metal rings.

7. The package of claim 1, wherein the outmost edges of upper layers of the plurality of dielectric layers are recessed more toward a center of the package than the outmost edges of respective lower layers of the plurality of dielectric layers.

8. The package of claim 1, wherein a bottommost ring in the plurality of metal rings is in contact with the encapsulant.

9. The package of claim 1, wherein one of the plurality of metal rings comprises a portion between two dielectric layers in the plurality of dielectric layers.

10. The package of claim 1, wherein each of the plurality of metal rings forms a full ring.

11. The package of claim 1 further comprising a seal ring spaced apart from the edges of the package, wherein the plurality of metal rings encircle the seal ring.

12. The package of claim 1, wherein portions of top surfaces and sidewalls of the plurality of metal rings form a plurality of steps.

13. A package comprising:
a device die;
a plurality of dielectric layers over the device die;
a plurality of metal lines over the device die, wherein upper lines in the plurality of metal lines are over, and are connected to, respective lower lines in the plurality of metal lines;
a plurality of metal rings encircling the plurality of metal lines, with upper rings of the plurality of metal rings being over and contacting respective lower rings of the plurality of metal rings; and
an underfill over the device die and contacting at least a bottom ring in the plurality of metal rings, wherein upper portions of the underfill are increasingly wider than respective lower portions of the underfill.

14. The package of claim 13, wherein the underfill is in physical contact with each of the plurality of metal rings.

15. The package of claim 13, wherein a top dielectric layer in the plurality of dielectric layers comprises a portion separating the underfill from upper rings in the plurality of metal rings, with the upper rings being over the bottom ring.

16. The package of claim 13 further comprising a molding compound molding the device die, wherein the bottom ring contacts the molding compound.

17. A package comprising:
a device die;
an encapsulant encapsulating the device die;
a first dielectric layer overlying and contacting the encapsulant;
a first metal ring comprising a first portion in the first dielectric layer to contact the encapsulant, and a second portion over the first dielectric layer;
a second dielectric layer over and contacting the first dielectric layer;
a second metal ring comprising a third portion in the second dielectric layer to contact the second portion of the first metal ring, and a fourth portion over the second dielectric layer;
a third dielectric layer over and contacting the second dielectric layer; and
a third metal ring comprising a fifth portion in the third dielectric layer to contact the fourth portion of the second metal ring, and a sixth portion over the third dielectric layer, and wherein the first metal ring, the second metal ring, and the third metal ring comprises four edge-sections, each adjacent to and parallel to an edge of the package.

18. The package of claim 17 further comprising a seal ring encircled by the first metal ring, the second metal ring, and the third metal ring.

19. The package of claim 18, wherein the seal ring is electrically floating.

20. The package of claim 18, wherein the first metal ring, the second metal ring, and the third metal ring are electrically floating.

* * * * *